United States Patent
Corcoran et al.

(10) Patent No.: US 8,463,581 B2
(45) Date of Patent: Jun. 11, 2013

(54) ASSEMBLY-BASED PARAMETRIC MODELER

(75) Inventors: David J. Corcoran, Lexington, MA (US); Heung-Wing Li, Chelmsford, MA (US)

(73) Assignee: Autodesk, Inc., San Rafael, CA (US)

(*) Notice: Subject to any disclaimer, the term of this patent is extended or adjusted under 35 U.S.C. 154(b) by 710 days.

(21) Appl. No.: 12/556,494

(22) Filed: Sep. 9, 2009

(65) Prior Publication Data
US 2010/0060635 A1    Mar. 11, 2010

Related U.S. Application Data

(60) Provisional application No. 61/095,763, filed on Sep. 10, 2008.

(51) Int. Cl.
*G06F 17/50* (2006.01)

(52) U.S. Cl.
USPC .................. 703/1; 700/95; 700/98

(58) Field of Classification Search
USPC ............................ 703/7; 345/420
See application file for complete search history.

(56) References Cited

U.S. PATENT DOCUMENTS

| | | | |
|---|---|---|---|
| 4,927,125 A | 5/1990 | Hunter | |
| 6,614,430 B1 * | 9/2003 | Rappoport | 345/420 |
| 6,844,877 B1 * | 1/2005 | Rajkumar et al. | 345/420 |
| 7,295,958 B1 * | 11/2007 | Suh et al. | 703/7 |
| 2002/0107673 A1 | 8/2002 | Haller et al. | |
| 2003/0208295 A1 | 11/2003 | Ishii et al. | |
| 2004/0098151 A1 | 5/2004 | Carlucci et al. | |
| 2004/0122630 A1 | 6/2004 | Fife | |
| 2005/0197822 A1 | 9/2005 | Onodera et al. | |
| 2006/0094951 A1 | 5/2006 | Dean et al. | |
| 2007/0124120 A1 | 5/2007 | Hamazoe | |
| 2010/0010655 A1 | 1/2010 | Corcoran et al. | |

OTHER PUBLICATIONS

Rafael Sacks, Charles Eastman, Ghang Lee Parametric 3D modeling in building construction with examples from precast concrete Automation in Construction 13, 2004, pp. 291-312.*
Y.-S. Ma, G. A. Briton, S. B. Tor, L. Y. Jin Associative Assembly Design Features: Concept, Implementation and Application Int J Adv Manuf Technol, (2007) 32, pp. 434-444.*
Softimage, "Types of Rigid Body Constraints", Softimage.wiki [online]. May 2006 [retrieved on Jan. 5, 2013]. Retrieved from the Internet: URL:http://softimage.com/xsidocs/rigidbody_cnst_TypesofContraints.htm>, pp. 1-3.
Holland et al., "Assembly features in modeling and planning", Robotics and Computer Integrated Manufacturing, 2000, vol. 16, pp. 277-294.
International Preliminary Report on Patentability from International Application No. PCT/US2009/049881, mailed Jan. 20, 2011, 6 pgs.
International Preliminary Report on Patentability from International Application No. PCT/US2009/056398, mailed Mar. 24, 2011, 6 pgs.
International Search Report and Written Opinion from International Application No. PCT/US2009/049881, mailed Jan. 27, 2010, 11 pgs.
International Search Report and Written Opinion from corresponding application No. PCT/US2009/056398, mailed Apr. 14, 2010, 11 pages.

* cited by examiner

*Primary Examiner* — Saif Alhija
*Assistant Examiner* — Cuong Luu
(74) *Attorney, Agent, or Firm* — Fish & Richardson P.C.

(57) ABSTRACT

Presently disclosed is a process and system for assembly-based parametric modeling having a single design environment in which the parts, components, and assemblies thereof may be designed concurrently. In embodiments of the present invention, every assembly has a deterministic parametric history supporting both top-down and bottom-up assembly design methodologies. Top-down components may be built in place, reducing the user interaction required to define the attachment and movement characteristics of the assembly. Bottom-up components may be inserted into an assembly using a parametric Insert Component Feature. The process and system also provides the ability to parametrically define the shape of an assembly in multiple orientations that still regenerate deterministically.

15 Claims, 26 Drawing Sheets

Fig. 2
Prior Art
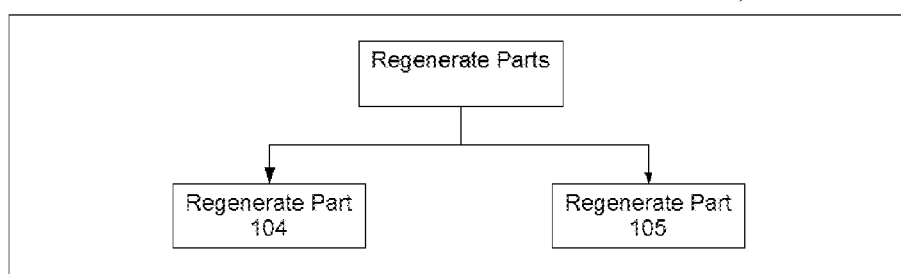
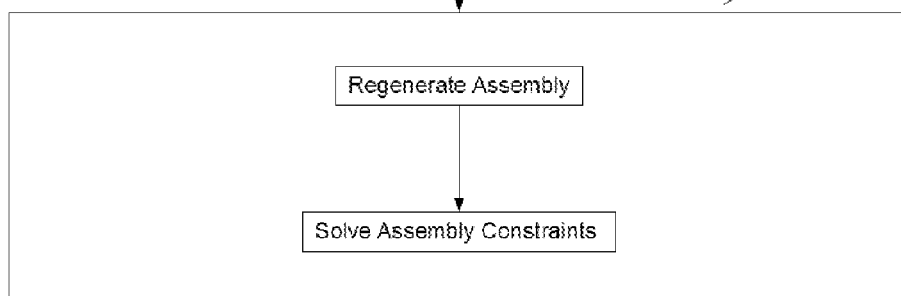
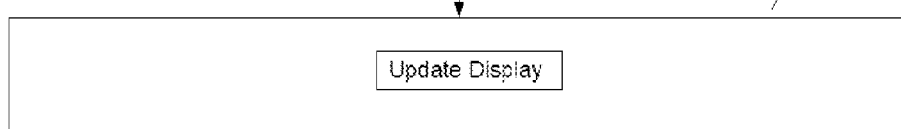

Fig. 9
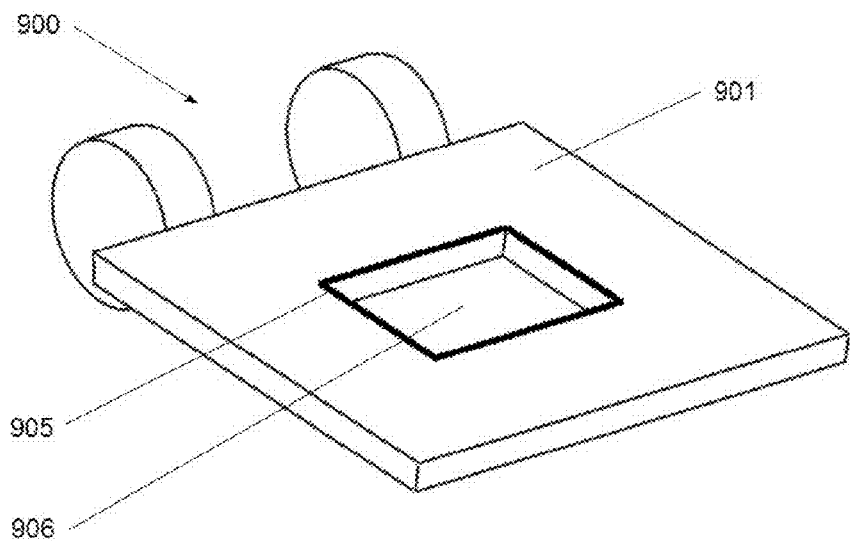
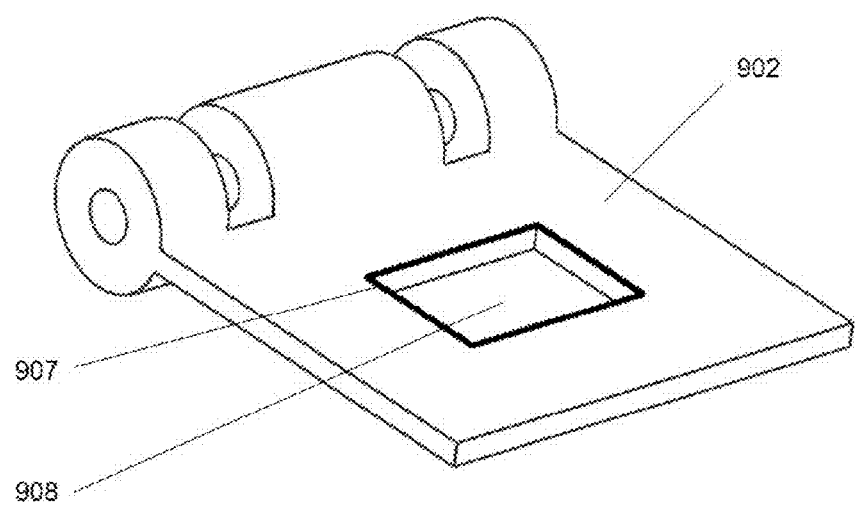

ASSEMBLY-BASED PARAMETRIC MODELER

CROSS-REFERENCE TO RELATED APPLICATIONS

This application claims priority to U.S. Provisional Application Ser. No. 61/095,763, entitled "ASSEMBLY-BASED PARAMETRIC MODELER," filed on 10, Sep. 2008, and incorporated herein by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to the field of three dimensional computer aided design (CAD) systems and software.

BACKGROUND

The prior art in parametric CAD software provides four major capabilities for an operator of the software, herein referred to as a user. First, it provides the ability to create virtual and accurate three dimensional renderings, or part models, of real world parts. Second, it provides the ability to edit and regenerate those parts with different parameters using a parametric history. Third, it provides the ability to put these parts together to form virtual three dimension renderings of real world products or sub-products, also called assemblies, and subassemblies, respectively, in a process referred to herein as "assembling". Fourth, it provides the ability to create documents and technical drawings of the parts and assemblies from the virtual part models and virtual assembly models (generally referred to as "models").

As used herein, the terms "parts," "components," and "assemblies" will be used to represent the virtual parts and virtual assemblies as they exist within a computer-aided design (CAD) system (also known as a "CAD system," "CAD computer system," or "CAD computer").

In addition to parts and assemblies, there also exist subassemblies, also referred to as assembled components. For example, a desk assembly could contain a drawer subassembly which contains a set of discrete parts. A subassembly is just an assembly which is contained in another assembly. Each time a part or subassembly is included in an assembly, that instance of the part or assembly is called a "component." A component has a reference to the part or subassembly which is inserted into the assembly, and has a definition of the position of that part in the assembly. So for a real world assembly that includes the same real world part twice, there is one assembly, one part, and two components. Each component references the same part but has a different position. Any assembly with multiple components could be divided arbitrarily into different subassemblies or could be considered a one level assembly consisting only of components referencing parts.

The prior art in parametric CAD systems and software is reduced to practice in several commercial CAD software products, including the Pro/ENGINEER® design software of Parametric Technology Corporation, the SOLIDWORKS® design software of SolidWorks Corporation, and the Autodesk Inventor® design software of Autodesk, Inc. The prior art has been commercially available in mechanical CAD products in relatively the same form for approximately 20 years and has been used to successfully assemble assemblies ranging from two parts to tens of thousands of parts.

Parametric modeling allows the user to create a model of a part by sequentially applying parametric features such as extrusions, cuts, fillets, shells, etc. Sketch features are used to define the planar profiles or cross sections on planar faces of the model, which can then be used as the basis for a modeling feature such as an extrusion, cut, or revolution. Another special feature type is a reference geometry feature. The most important reference geometry feature is the work-plane feature, which is most often used to define a plane on which the user can create a sketch when no appropriate planar face exists on the model. A modification feature modifies a previously defined modeling, sketch, or reference geometry feature. As the features are applied, a parametric history of the features is recorded. This parametric history can then be re-executed to regenerate the part. The user can also change parameters of the features to regenerate the part with different dimensions. The user can also edit the parametric history itself, by deleting features, inserting features, reordering features, etc., to change the model.

In the process of adding features to the model, the user makes parametric references to the topology of the model being constructed. The parametric reference data structures are quite sophisticated, so that when the parametric history is regenerated with different parameters or the parametric history itself is edited, the local changes in topology that result will have minimal impact on the successful regeneration of downstream features and their parametric references.

There are four powerful strengths of a part parametric history in the prior art. First, it fully describes the creation of a part from scratch in a data structure which is independent from the resultant geometric model. In other words, at the end of modeling, the user not only has the geometric model, but he or she also has a parametric history that can produce that geometric model from scratch. Second, the steps (or parametric feature operations) of the parametric history are originally input by the user, making the parametric history convenient for the user to understand and alter. The parametric history is like a recipe, with the added advantage that the user can back up, alter, and replay the steps. Third, it is fully deterministic, which means that the steps are applied in a consistent order which is apparent to and modifiable by the user and the result is fully determined by those steps. Fourth, features and parametric references are defined in the context of and relative to the prior features of the part. So for example, the same hole on a square face could be dimensioned to any of the four corners or constrained at the center of the face. If the face is resized, the hole will retain the relative positioning as specified by the parametric references the user specified. Thus the user defines a specific "design intent" in the parametric part of his or her choosing. As a consequence of these strengths, parametric part modeling is robust, understandable, and intuitively editable by the user.

In the prior art, there are two distinct environments for the user, a part environment and an assembly environment. The part environment is used to define the shape of the parts. The assembly environment is used to assemble parts and subassemblies into assemblies, and to perform other assembly level operations, like defining movement, exploded views, configurations, etc.

Bottom-up design and top-down design are two distinct methods of designing an assembly. In a pure bottom-up design, the user first designs each of his or her parts independently of each other in the part environment. Then the user puts the parts together in the assembly environment. In a pure top-down design, the user designs his parts all together at once at the same time. In a top-down design, it is natural for one feature to impact several parts, or for one modification feature to modify one part by referencing another part. In a bottom-up design, this is not possible, as only the part being designed is available to be referenced and modified.

When parametric modeling was first introduced in the Pro/ENGINEER® design software in the late 1980s, it was primarily a bottom-up approach. In a bottom-up design, each part is designed on its own in the part environment and has its own independent parametric history. The parametric history specifies only the shape of the part, not its orientation in any assembly that includes it. The user then activates the assembly environment and inserts the parts into the assembly as assembly components. The components are then assembled together in the assembly environment by applying assembly constraints to move the parts into position, such as making two faces coplanar or two axes collinear. Assembling does not change the shape of the parts, just the orientations.

FIG. 1 shows the data structures of a simple bottom-up parametric assembly. Assembly 101 consists of components 102 and 103, each of which is defined by parts 104 and 105 respectively. Parts 104 and 105 each have its own parametric histories 106 and 107 respectively. Assembly 101 also has assembly constraint system 108, comprised of the assembly constraints that define the positions of the assembly components. Each parametric history in each part is a data structure consisting of an ordered sequence of features used for regenerating (or reproducing) the parts. Each feature creates new or modified model geometry. For example, feature 109 produces model geometry 110 in part 104. Each feature also has parametric references to the model geometry used as input to that feature and that that exists at the time the feature was created. For example, arrow 111 represents a parametric reference used by feature 109 to the model geometry 113 that resulted from feature 112.

FIG. 2 shows the regeneration sequence of parametric assembly 101. In step 201, the parametric histories of parts 104 and 105 are regenerated. At this stage, the new shapes of both parts are fully defined. Note that since the parametric histories 106 and 107 are completely independent of each other, parts 104 and 105 could in fact be regenerated in either order and the shapes of the parts would turn out the same. Thus, changing one part in a bottom-up design cannot impact the shape or robustness of regeneration of any other part. Once all the part regeneration is complete, in step 202, the system regenerates the assembly. In a bottom-up design, regenerating (reproducing) the assembly consists of re-solving the assembly constraints 108 based on the new shapes of the parts, which in turn defines new orientations for the assembly components defined from those parts. In step 203, the system updates the display of the assembly based on the new orientations and the new part shapes, and the regeneration is complete. Note that in a bottom-up design, changing the assembly constraints cannot impact the shape of any bottom-up component, only its orientation. As a result of the above-described characteristics, a bottom-up design can be regenerated in one pass, meaning each feature, part, and the assembly constraint system needs only to be exercised (i.e., solved, also referred to as "regenerated") at most once to regenerate the assembly.

A simple physical illustration is shown in FIGS. 3A and 3B. In FIG. 3A, the user starts with the assembly 101 containing the two parts 104 and 105. Part 104 also has parametric dimension 301, which indicates the height of part 104 is 5 inches. The user then changes (i.e., edits) parametric dimension 301 from five inches to ten inches and instructs the system to regenerate the assembly. This executes in the regeneration sequence described above, and produces the new version of assembly 101 shown in FIG. 3B, with the new shape of part 104 as defined by the new value of dimension 301, and the same relative position of parts 104 and 105, as defined by assembly constraint system 108.

A bottom-up parametric assembly regenerates deterministically, meaning that any two regenerations of the assembly given the same set of input parameters will always produce the same resulting physical model. Parametric regeneration of bottom-up assemblies is deterministic for the following reasons. First, every parametric feature is deterministic. Given the same input, which consists of parametric references to the model at the time the feature is applied (such as a reference to the edge to be filleted), and inputs to the feature (such as the radius of the fillet), the feature will produce the same geometric result. A parametric history of a bottom-up part is just a sequence of these bottom-up parametric features. So the entire parametric part regeneration is also deterministic. The assembly regeneration of a bottom-up assembly consists of exercising (i.e., solving) the assembly constraint system to determine the new orientations of the assembly components based on the new shapes of the parts and their prior orientations. Thus the entire bottom-up assembly regenerates deterministically.

This deterministic nature of the regeneration can be seen graphically in FIG. 1. Each arrow in FIG. 1 represents a dependency. The dependencies all flow in one direction; there are no cycles. This set of relationships can be represented in a graph using the well known mathematical area of study called graph theory. The bottom-up set of relationships shown in FIG. 1 can be converted to a directed graph. A generic directed graph is shown in FIG. 4. Each circle is a node. Each arrow is a dependency relationship between the nodes. Each node represents a process step in the bottom-up regeneration, such as a parametric feature in a part parametric history or the exercising/solving of the assembly constraint system. Each arrow represents a dependency relationship in the bottom-up regeneration. These relationships were also shown in FIG. 1 as arrows. In a directed graph, there are no cycles and the graph can be processed in one pass. This single pass is performed by first processing nodes with no dependencies, and then processing nodes that have had all of their dependencies processed, until all nodes are processed. The numbers inside the circles represent one solution for ordering the nodes to process them in one pass.

Another desirable property of bottom-up parametric design is that if the user changes the input parameters, the model will regenerate as if it has been built from scratch with those changed parameters. This makes any failures or unexpected results from changing parameters understandable to the user and thus generally easy to correct. In fact, the user can step through each node in the regeneration sequence to see exactly why it failed. These attributes make the bottom-up design approach very predictable and robust in the prior art.

However, the major disadvantage of the bottom-up approach is that many parts in an assembly share the same or similar geometry. Since the parts' parametric histories are independent, the user must re-specify the shared geometries in each part to make them match. This results in duplicated information. Since the parametric histories of the parts are independent, if the user decides to change the similar geometries, he or she needs to change them in both parts, and must make sure to change them consistently. This results in extra work and often in errors. One of the greatest strengths of parametric modeling at the part level is that the user need only define his design intent once, and if that design intent is referenced multiple times in the part, the user need only change it once, and all references will update as expected. Unfortunately, the duplication of design intent described above for bottom-up assemblies negates this strength at the assembly level in a bottom-up design.

Over time, commercial parametric products of the prior art introduced various methods of specifying top-down design intent. Most of these methods are available in roughly the same form in each of the commercial products employing the prior art. These prior art methods include: assembly features, assembly-context part features, multi-body parts and derived parts.

The fact that there are so many different methods of designing parts top-down in an assembly is testament to the fact that it is a desirable capability. In fact, most or all of these methods exist concurrently in each of the prior art commercial systems previously mentioned. However, it is also testament to the fact that, unlike bottom-up design, no single effective method of creating parametric top-down design exists in the prior art.

Unfortunately, each of these methods of top-down parametric modeling has drawbacks that make it less robust than the single method of bottom-up parametric modeling. These methods do not regenerate in a deterministic manner, thus making it difficult for the user to understand and to modify the parametric design. These methods produce multiple unsynchronized parametric histories with interdependencies, which cannot be stepped through in the simple manner of a bottom-up part history. Also these methods introduce duplicate ways of creating the same geometry with no real functional differentiation, just different limitations, making the user interaction complex and prone to error. Finally these methods create restrictions and undesirable interactions between the parametric definition of the parts' shapes and the definition of the parts' orientations and movement within the assembly.

It would be desirable if a single method could be devised that allows assemblies to be parametrically designed using both top-down and bottom-up methods in a deterministic manner with the same robustness, simplicity and deterministic behavior with which individual parametric parts can be parametrically designed in the prior art. It would also be desirable if the attachment and movement of parts in the assembly could be specified concurrently and in the same environment as the part shapes are defined.

SUMMARY

The presently disclosed invention is an apparatus and process for assembly-based parametric modeling and design of mechanical assemblies.

In embodiments of the invention, there is a single Design Environment which contains one top level assembly in which the parts and the assembly are designed concurrently. Each and every assembly so designed has a parametric model Design History which contains parametric features. This Design History is a deterministic parametric history of the assembly which supports both top-down and bottom-up design. The Design History extends the robustness and deterministic regeneration of single parametric part definition in the prior art to full parametric assembly definition.

In embodiments of the present invention, the same parametric feature can work on an individual component or on multiple components at once. For example, there may be only one hole feature. The hole feature can be applied to as many components as desired. There are also component level features for operating one on or more entire components at once, such as split, subtract, merge, fill, mirror, pattern, etc. Even features such as fillets and shells, that affect (modify) each component independently, can be applied to multiple components at once. These features all exist in the same Design Environment and can be used within the same Design History. Thus there is no need for derived parts, special assembly level features, or differentiation between a local part feature and an assembly context part feature.

Similarly, in some embodiments of the present invention, there is only one sketch feature and only one work-plane feature. Different regions of the same sketch feature can be used to define complementary features on multiple components. In this manner, the sketch concept of the prior art is naturally extended to an assembly layout sketch. The same work-plane can be referenced to define multiple complementary parts as well.

In some embodiments, all parametric modeling operations are done within the Primary Design Configuration of the assembly. The Primary Design Configuration specifies a single primary orientation for each component in the assembly. That orientation is the orientation that is generated for that component by reproducing the Design History. Even components which are allowed to move within the assembly have a single primary orientation specified within the Primary Design Configuration. When the user wants to add or edit parametric features, the system is reset to the Primary Design Configuration. By resetting the Primary Design Configuration whenever a feature is added, the parametric references from that feature to the other components of the assembly are deterministic. Since the Design History is a sequence of deterministic parametric features that create the assembly, the top-down design is deterministic as well.

The above paragraphs explain why an assembly containing components built top-down in an embodiment of the present invention is deterministic. However, assemblies must also support the insertion of components designed externally, or bottom-up. In some embodiments, the insertion of a bottom-up component may be performed by using a parametric feature of the present invention called the Insert Component Feature. The Insert Component Feature is deterministic like other parametric modeling features, defining a single primary orientation of the inserted part relative to the rest of the assembly at that point in the Design History. This single orientation becomes the orientation for that component in the Primary Design Configuration. The present invention therefore makes the regeneration of assemblies that include bottom up components fully deterministic. It also makes the intermixing of top-down and bottom-up design techniques fully deterministic.

It would be a useful capability to design a product parametrically in multiple valid orientations. For example, it could be useful to design part of a sliding bolt assembly for a door lock in the closed position and part in the open position. Since the Primary Design Configuration is one specific position for the assembly, this is not possible in what has been described above. Therefore, in some embodiments of the present invention, a new feature referred to herein as the Insert Secondary Design Configuration Feature is introduced. The Insert Secondary Design Configuration Feature records the current positions (referred to herein as "secondary orientations") of the assembly in a manner that can be regenerated parametrically. Subsequent features are then parametrically captured in the context of this Secondary Design Configuration in the Design History. Thus a product can be designed in multiple valid configurations or orientations under the user's control.

Because top-down components are built in place, embodiments of the present invention reduce the user interaction required to define the attachment and movement characteristics of the assembly relative to the prior art. For example, when two parts are built in place, no geometry needs to be selected to make them rigidly connected. In the prior art, several assembly constraints needed to be added and several geometries needed to be selected to create the same rigid attachment.

In summary, embodiments of the present invention allow the user to parametrically define the shape, orientation and movement of a parametric assembly in a single design environment, using both top-down and bottom-up part design techniques, in a robust and fully deterministic manner. The user interaction requires only a single design environment and no duplication of parametric features for top-down and bottom-up modeling. Thus, the simplicity and robustness of parametric single part design in the prior art is extended to full multi-component product design by the present invention. The practical benefit of the invention is that users can design products faster and more reliably, thus reducing the time and expense required to bring products to market.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 2 illustrates the regeneration sequence of a parametric assembly 101, as known and used in the prior art.

FIG. 9 illustrates an example of assembly context part features.

DETAILED DESCRIPTION

Figure 1:
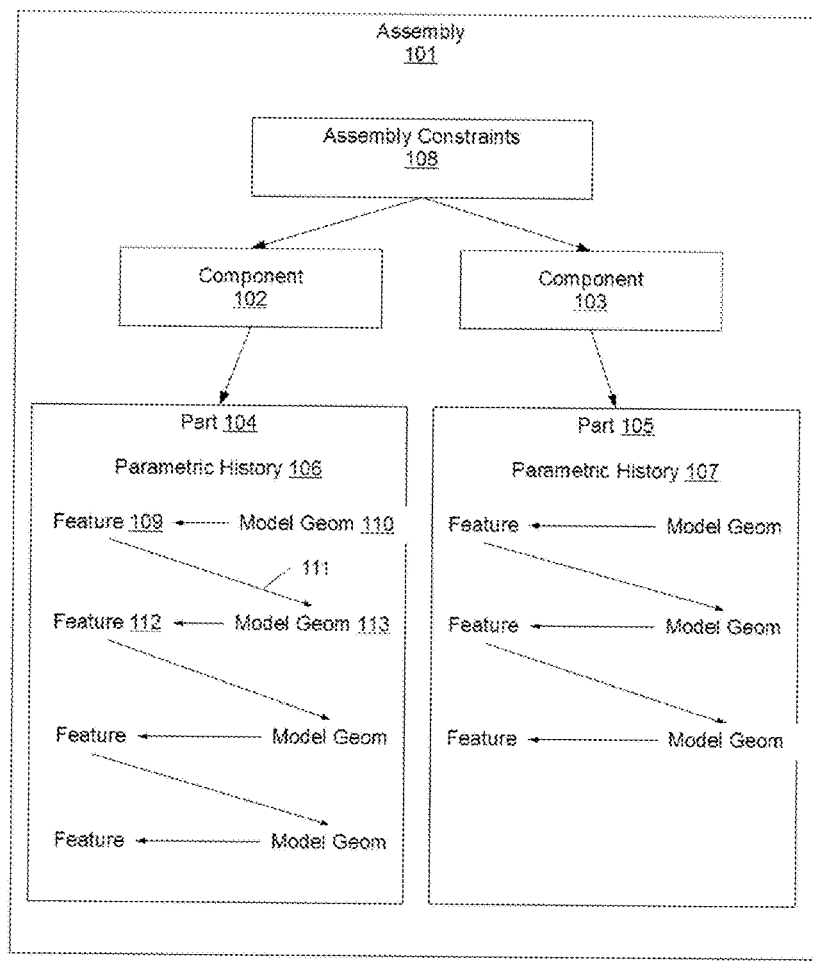
FIG. 1 illustrates the structure of a simple bottom-up parametric assembly, as known and used in the prior art.
Figure 3A:
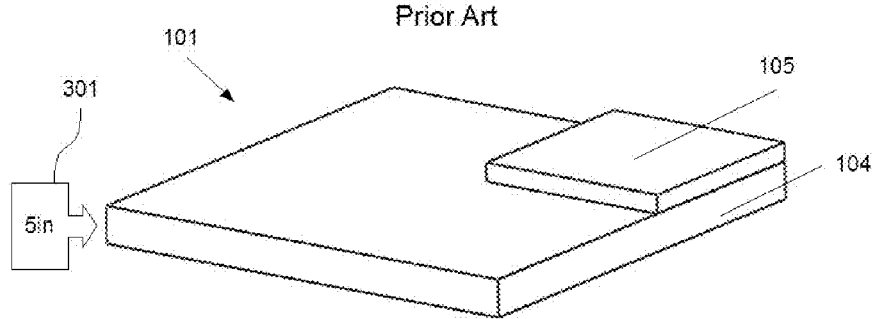
FIG. 3A illustrates a "before" view of a parametric assembly, as known and used in the prior art.
Figure 3B:
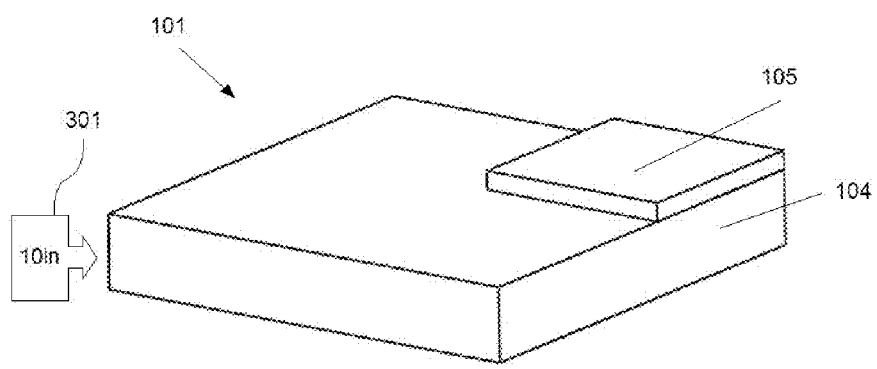
FIG. 3B illustrates an "after" view of a parametric assembly, as known and used in the prior art.
Figure 4:
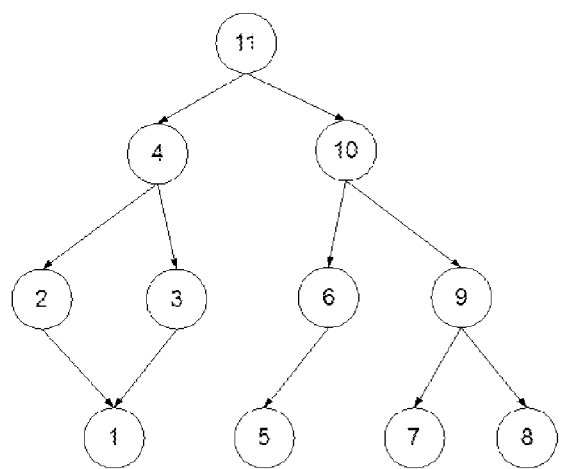
FIG. 4 illustrates a generic directed graph.

First, a high level architectural overview of an embodiment of the invention will be presented. Second, the top-down parametric design methods employed in the prior art will be described. Third, aspects of an embodiment of the present invention will be described. Fourth, deficiencies of the prior art will be described and how they are addressed by an embodiment of the present invention will be explained. Fifth, the implementation of top-down design in an embodiment of the invention will be described in detail. Sixth, the implementation of bottom-up design, and the manner in which mixed bottom-up and top-down design is supported, will be described in detail.

As mentioned earlier, any assembly with multiple components could be divided arbitrarily into different subassemblies or could be considered a one level assembly consisting only of components referencing parts. For the purposes of this detailed description, it is sufficient and more straightforward to present the invention and the prior art using examples involving one-level assemblies. However, the invention is equally applicable to multi-level assemblies.

Architectural Overview

A typical computerized CAD system is configured to include one or more central processing units (CPUs); input devices such as a computer mouse, graphics tablet, pointing device, and a keyboard; storage devices such as a disk or tape drives, Internet-based storage, and/or on-line and off-line systems as those terms are known in the art; and graphical display devices, such as a computer monitor, projector, printer, or the like; and one or more CAD programs.

Although specific examples of commonly-available and well known computer systems and peripherals are described above as examples, those skilled in the art will realize that the types of computer systems and devices used with the presently-disclosed CAD system are not limited in any way. One of ordinary skill in the CAD arts will readily appreciate that a wide range of useful interface, input, output, print, display, and computational devices may be used. Accordingly, the present invention is not limited to any particular type of implementation of system, computer, processor, or peripheral.

The CAD programs may be provided in executable program form, source code, object code, micro-code, or the like and on a variety of computer-readable media useable with the aforementioned hardware components. For example, but not by way of limitation, CAD program(s) (consisting generally of computer instructions) may be stored in memory, supplied on a computer-readable medium of any type known or used in the broad computer arts, or transmitted via a network. A computerized CAD system (including its computer instructions, also generally referred to as "software") could be local, like a desktop computer, or distributed, like a web application. The present invention may use any or all of these components; one of ordinary skill in the art will appreciate that ordinary variations in the hardware configuration may be accommodated without departing from the scope of the present invention.

Figure 5:
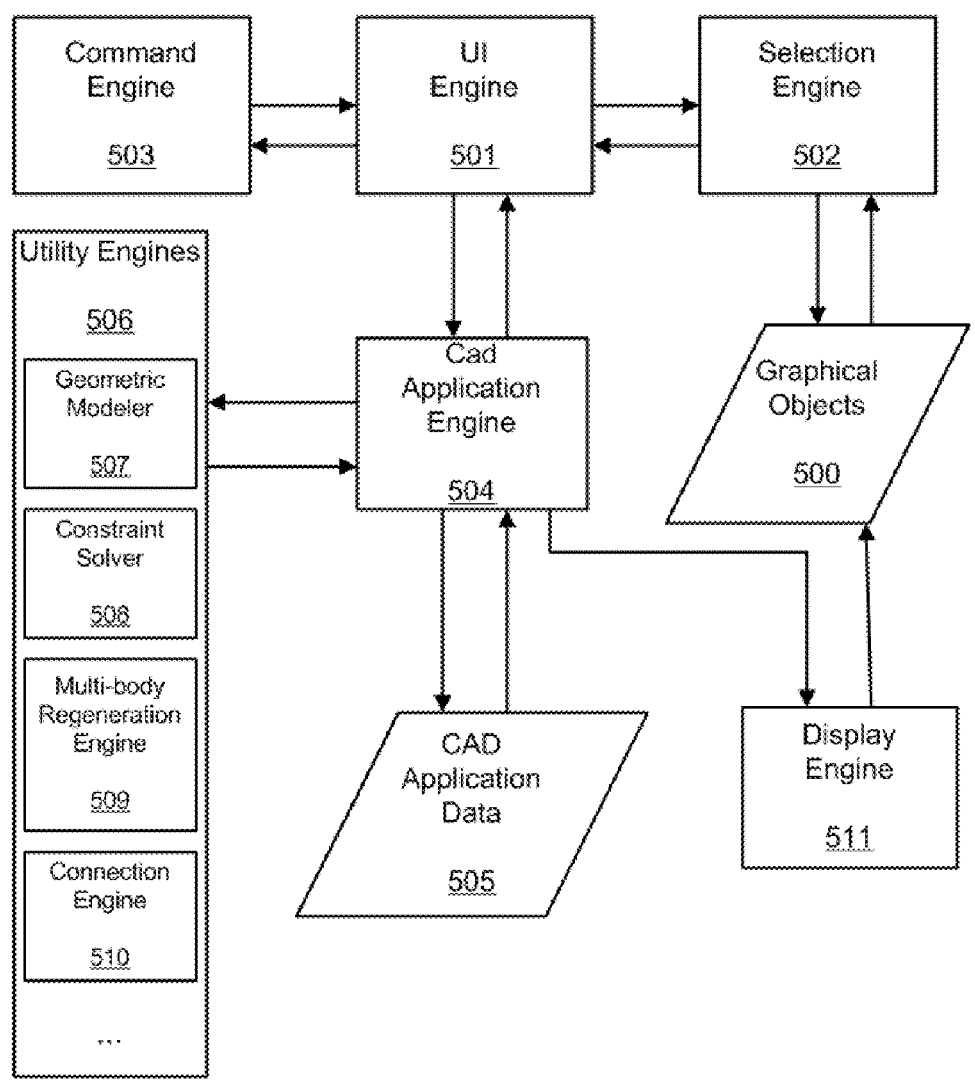
FIG. 5 is a flowchart illustrating the interaction of the major components of a CAD system, according to one embodiment of the present invention.

FIG. 5 shows the interaction of the major components of a CAD program for assembly-based parametric modeling and design of mechanical assemblies, according to an exemplary embodiment of the present invention. The user drives the system through the user interface (UI) engine 501. The UI engine employs the selection engine 502 to select graphical objects 500 to act upon. The UI engine employs the command engine 503 to specify operations for the CAD application engine 504 to perform. The CAD application engine processes the CAD application data 505 to perform these operations, updates the CAD application data accordingly, and informs the UI Engine of the results. In the process of performing its work, the CAD application engine employs utility engines 506 that perform specific functions. Utility engines 506 include a geometric modeler 507, a constraint solver 508, a Multi-body Regeneration Engine 509, and a Connection Engine 510. The UI Engine then uses the Display Engine 511 to display the results to the user in textual and graphical form.

Multi-body Regeneration Engine 509 is the software component that manages and regenerates the parametric features and parametric references. In some embodiments of the present invention, it may be similar to regeneration engines that are known in the prior art in a parametric multi-body part modeler. Such an engine is sufficient to regenerate a bottom-up design. However, prior art regeneration engines, as noted above, are not capable of also regenerating top-down designs in a fully deterministic fashion. For this, the Multi-body Regeneration Engine 509 is required to reproduce the single Design Environment for both part-level design and assembly-level design, the Primary Design Configuration, and the Insert Component Feature capabilities discussed above. These additional aspects are described in detail below.

Connection Engine 510 performs the positioning functions for each component. Connection Engine 510 is fully defined in U.S. Provisional Patent Application Ser. No. 61/080,161, entitled "Assembly Connection Method for Attaching Virtual Parts in a Computer Aided Design Software Environment", which was filed on Jul. 11, 2008, and is hereby incorporated herein in its entirety. Specifically, Connection Engine 510 provides the following capabilities. First, it provides the ability for the user to specify how one component is attached to another using a Connection. The components may be connected rigidly by using a Rigid Connection or in a manner that allows movement by using a Moving Connection. Second, in the case of a Moving Connection, an embodiment of the invention requires the user to specify a Preferred Position, which is one discrete relative position between the two components attached by the Moving Connection. Each of these capabilities is fully described in the above-noted Provisional Patent Application.

Top-Down Design Methods in the Prior Art

To understand how top-down design is implemented in an embodiment of the invention, and how it is an improvement over the prior art, it is important to fully understand the prior art methods of top-down design and their implementation. They are described below.

Prior Art Top-Down Method One—Assembly Features

Figure 6:
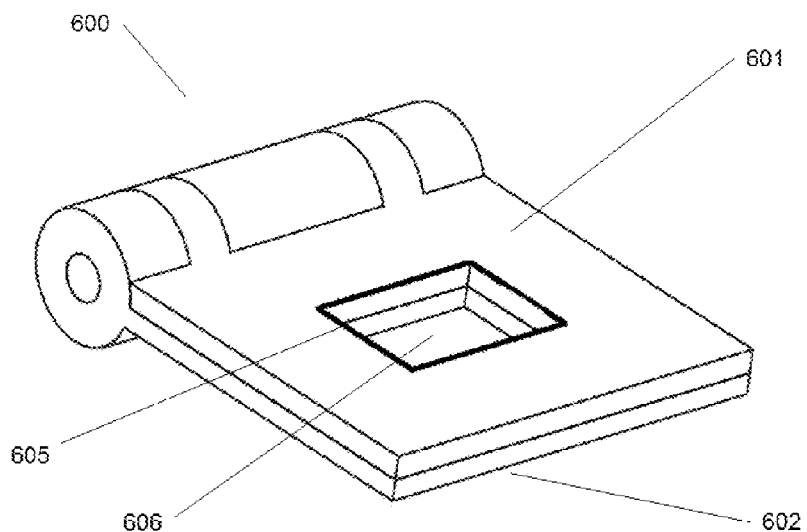
FIG. 6 illustrates an example of an assembly sketch feature and assembly hole feature.
Figure 7:
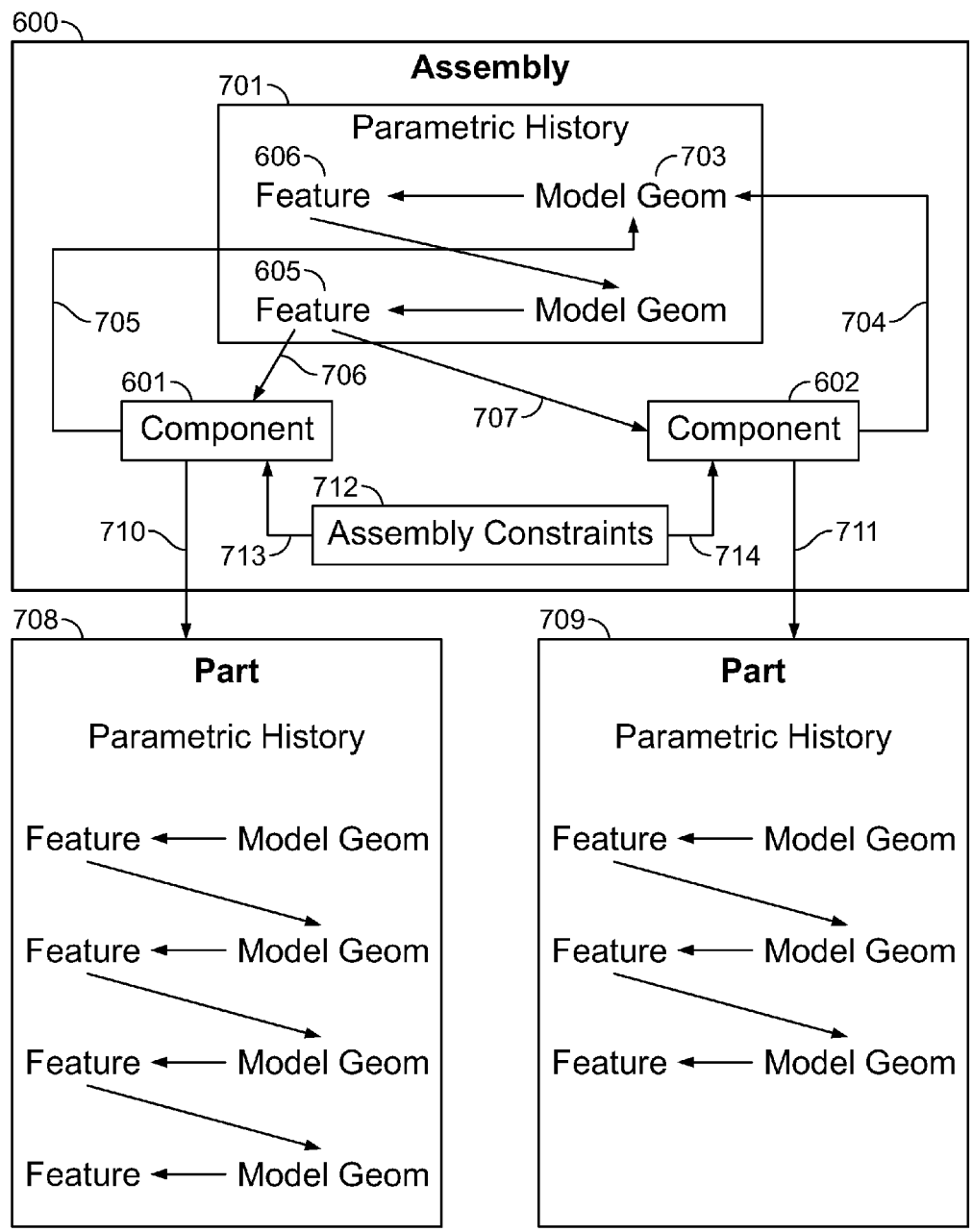
FIG. 7 illustrates the parametric history of an assembly sketch feature and assembly hole feature.

Assembly features are parametric features that are performed in the assembly environment and recorded in a separate history that belongs to the assembly. Because they are defined in the assembly environment, they can be defined to impact multiple components. An example of an assembly sketch feature and assembly hole feature is shown in FIG. 6. The user began with assembly 600 containing two components 601 and 602. The user then defined assembly sketch 605 (the sketch is shown in the thicker line weight). Then an "assembly hole" feature 606 was applied to both components using sketch 605, resulting in a hole through both components as shown. The resulting data structures are shown in FIG. 7. This data structures are equivalent to the data structures shown in FIG. 1, with the following additions. First, there is now an additional parametric history 701 in the assembly. Assembly parametric history 701 includes assembly sketch feature 605 and the assembly hole feature 606 as shown. Assembly hole feature 606 produces model geometry 703, which is the geometry on components 601 and 602 produced by assembly hole feature 606. Arrows 705 and 704 represent these dependencies respectively, namely that the shape of components 601 and 602 with the holes is dependent on the model geometry 703 produced by assembly hole feature 606. Also note that the original shapes of components 601 and 602, which are their shapes before assembly hole feature 606 was applied, is defined by parts 708 and 709. These dependencies are represented by arrows 710 and 711 respectively. Finally note that the position of components 601 and 602 are defined by solving assembly constraint system 712, as represented by arrows 713 and 714 respectively. It is important to note at this time that, unlike the dependencies shown in FIG. 1 for a bottom-up design, this dependencies (represented by arrows) in this top-down design do not all flow in one direction and indeed create cycles of dependencies. The implications of this will be discussed later.

Figure 8:
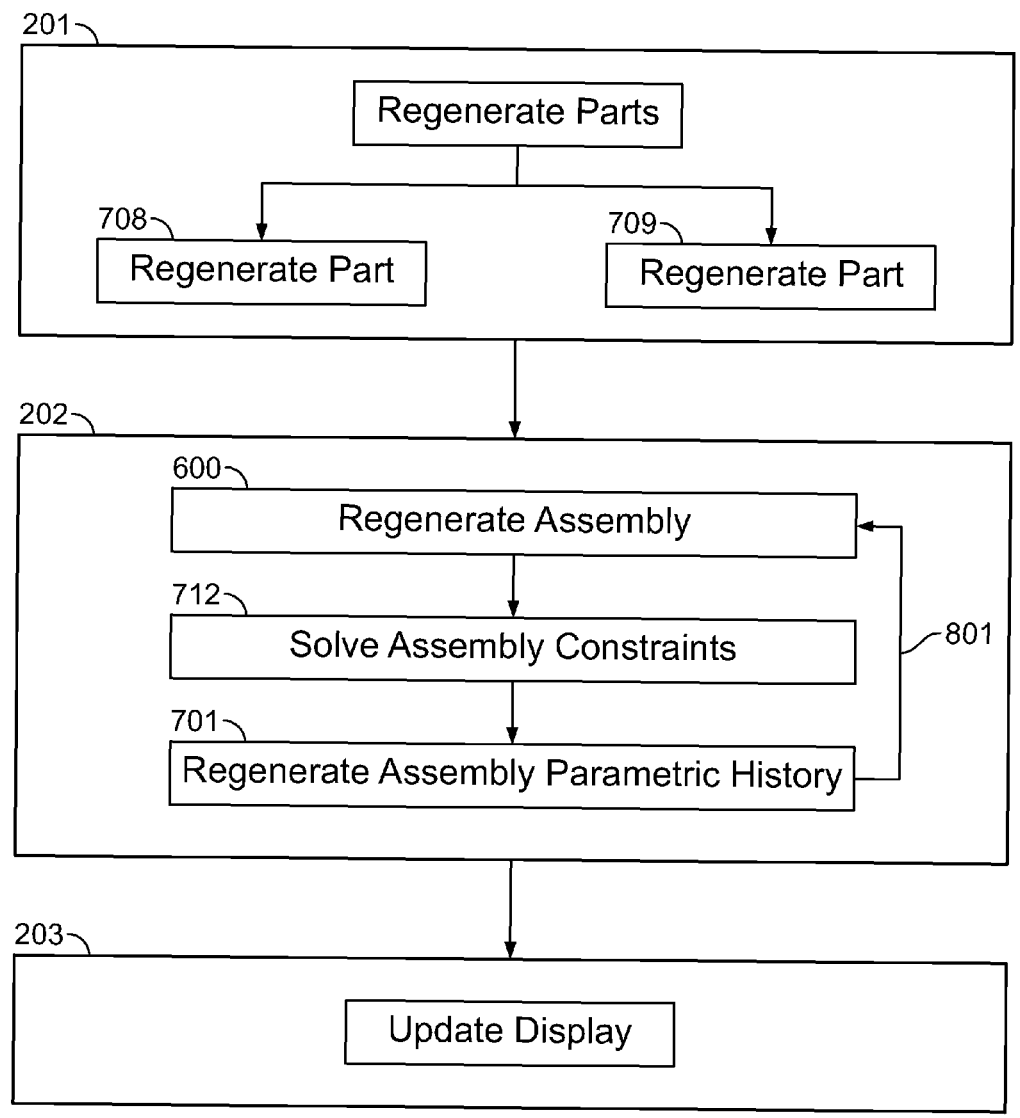
FIG. 8 illustrates the assembly regeneration sequence of an assembly sketch feature and assembly hole feature.

The assembly regeneration sequence is shown in FIG. 8. It is similar to the assembly regeneration sequence described earlier in FIG. 2, with the addition of regenerating assembly parametric history 701 within regenerating the assembly 600. Arrow 801 indicates that multiple passes of assembly regeneration can be required when assembly features are dependent on positioning resulting from solving assembly constraints and vice versa. This is a by-product of the cycles dependencies discussed above.

Assembly features only exist in the assembly context, not in the part context. Thus if the assembly was closed and then one of parts was later opened, the assembly sketch and the assembly hole would not be in the part. Another important thing to note is that despite many similarities, an assembly hole feature and a part hole feature are two distinct operations from the user's perspective, which are available in different environments with different capabilities and restrictions.

Prior Art Top-Down Method Two—Assembly-context Part Design

Assembly-context part design allows the user to insert part modeling features into the part's history within the context of the assembly. In pure bottom-up part design, the user cannot reference the assembly. In assembly-context part design, the user can activate a specified part component in an enhanced version of the Part Environment. This version is enhanced to allow the user to see and parametrically reference all of the components of the assembly while executing part level parametric features on the activated part. The user can then insert the part modeling features into the activated part's parametric history. However, unlike in pure bottom-up design, the user can also parametrically reference the geometry of the other components in the assembly. The part features can only change the geometry of the activated part; they cannot change the geometry of other parts in the assembly.

As an example, consider the two component assembly 900 shown in FIG. 9, which is physically identical to assembly 600 that was shown in FIG. 6. FIG. 9 shows assembly 900 in an exploded view so it is easier to see the operations on each individual part. Assembly 900 contains components 901 and 902 which reference parts 1013 and 1014 respectively (see FIG. 10). The user first activated component 901 in the context of assembly 900, which in turn activated part 1013. Then the user created a part sketch 905 in part 1013. Then the user put part level hole 906 in part 1013 using sketch 905. Note that the user could not create a hole in both parts at once, because part features may only change the geometry of the part to which they belong. Next the user activated the other component 902, which in turn activated part 1014. Then the user created part sketch 907 in part 1014 by projecting sketch 905 into part 1014. Then the user created the corresponding hole 908 in part 1014 from sketch 907. Because sketch 907 is derived from sketch 905, the user can change sketch 905 and the entire assembly will parametrically regenerate as is expected in a top down design.

Figure 10:
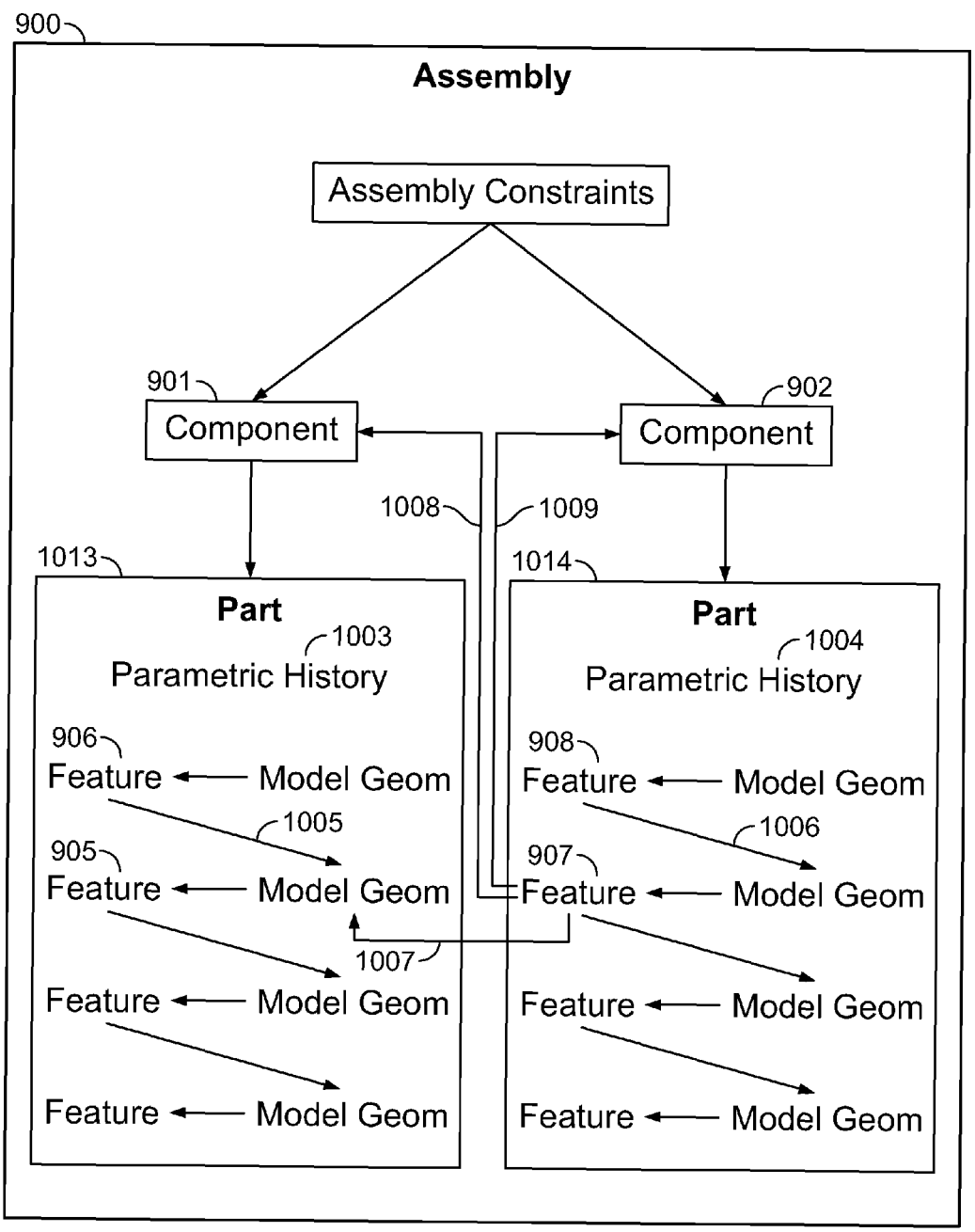
FIG. 10 illustrates the parametric history of assembly context part features.

The resulting data structures are shown in FIG. 10. Note that there is no parametric assembly history added as was the case for assembly features; the additional information is added to the parts' histories instead. Specifically, parametric history 1003 of part 1013 has a reference 1005 from hole feature 906 to the model geometry created by sketch feature 905. Additionally, parametric history 1004 of part 1014 has a reference 1006 from hole feature 908 to sketch feature 907. However, sketch feature 907 in part 1014 was derived from sketch feature 905 in part 1013. This is shown by parametric reference 1007. Also, sketch feature 907 is dependent on the positions of both component 901 and 902 in assembly 900, because the projection of the sketch from one part to the other is based on the relative positions of the components in the assembly. These dependencies are shown by parametric references 1008 and 1009. It is again important to note at this time that, unlike the dependencies shown in FIG. 1 for a bottom-up design, these dependencies (represented by arrows) in this top-down design do not all flow in one direction and indeed create cycles of dependencies, and this case, dependencies between the part histories themselves.

Again, because the position of assembly context features can be dependent on component positions, and component positions can be dependent on assembly context part features, regenerating the assembly can take multiple passes.

Prior Art Top-Down Method Three—Multi-body Parts

Commercial parametric modeling products have separate part and assembly environments. The part environments of early versions of the products originally had no or very little support for multiple solid bodies within a single part. Instead, they allowed one solid to evolve through the application of parametric features. Over time, some of the products developed more and more support for multiple bodies. One reason was that it is sometimes convenient for the user to build a part in separate pieces that were eventually merged together into a single body. An example is a dumbbell, where it may be easier to build the two ends before building the bar which connects them. Some commercial systems, such as the SOLIDWORKS® design software of SolidWorks Corporation, allow multiple independent bodies to be designed effectively in the part environment.

Figure 11:
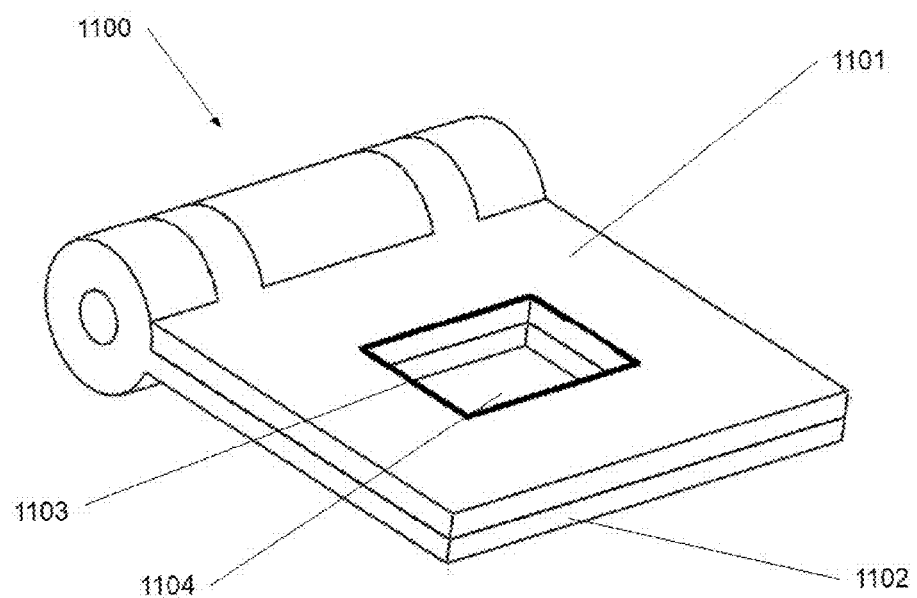
FIG. 11 illustrates an example of multi-body part features.
Figure 12:
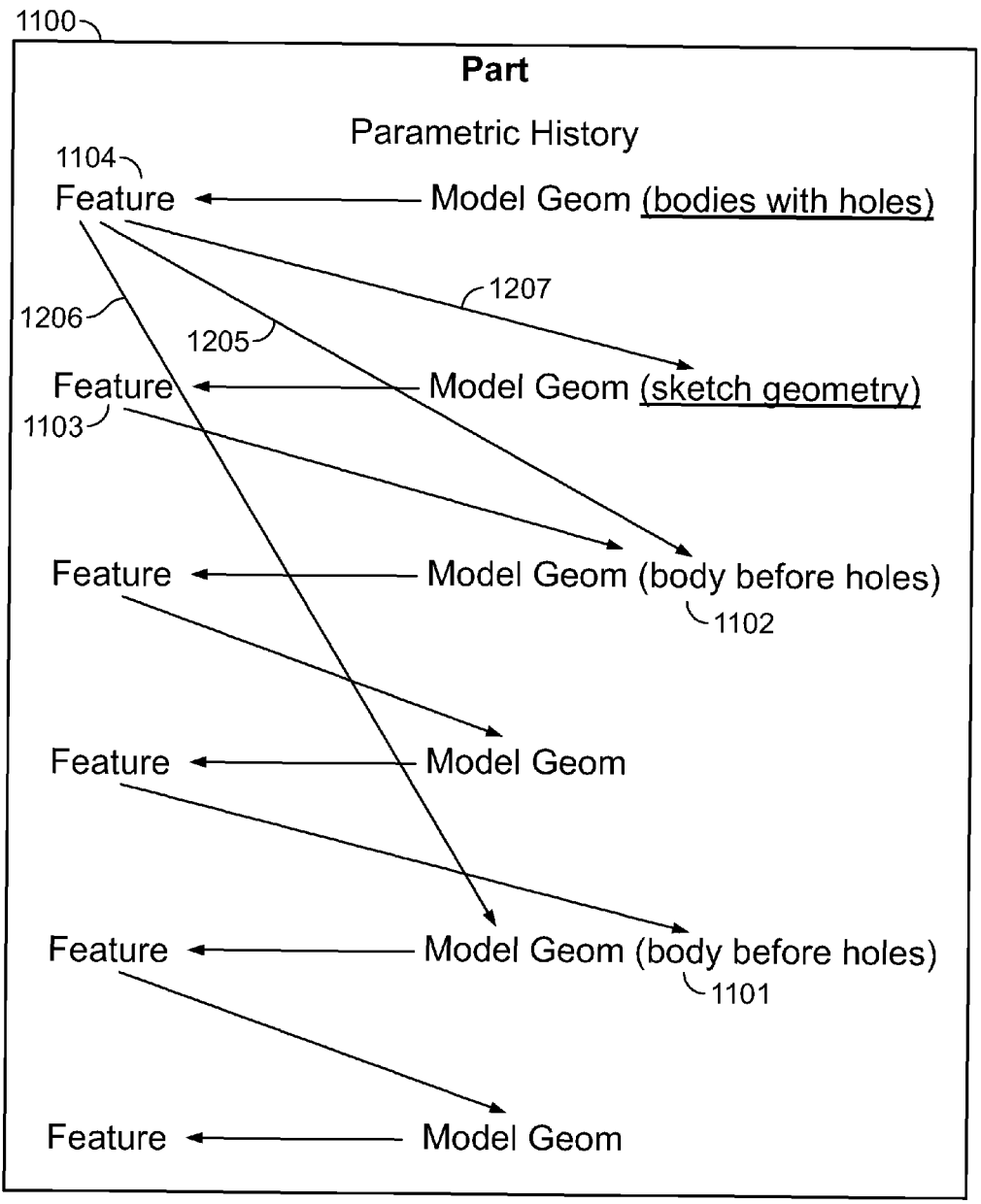
FIG. 12 illustrates the parametric history of multi-body part feature.

As an example, consider the multi-body part 1100 shown in FIG. 11, which is physically identical to assembly 600 that was shown in FIG. 6. In this example, the user built the two bodies 1101 and 1102 in the same part in the correct place as shown. There are no assembly constraints and no assembly; there is just a part containing two bodies built in place. The user then created sketch feature 1103 and then created part hole feature 1104 from sketch 1103 through the two bodies 1101 and 1102. Because multiple bodies exist in the same multi-body part, the part level hole feature can be made to operate on multiple bodies. In this case the data structures appear as in FIG. 12 and there is no assembly model at all. Hole feature 1104 references the sketch produced by sketch feature 1103 as shown by arrow 1207. Hole feature 1104 also references bodies 1102 and 1101 before the hole was applied, as shown by arrows 1206 and 1205 respectively. The parametric history of a multi-body part has the same structure and deterministic behavior as any other bottom-up parametric part. There are no cycles of dependencies introduced; the dependencies all flow in a single direction as in FIG. 1.

One may wonder, since the user already has the bodies he or she wants in the multi-body part, why does the user need an assembly at all? One reason is that, in the prior art, all the functionality that is specific to assemblies, such as adding assembly movement, bottom-up assembly, exploded views, assembly configurations, etc., exists only in the assembly environment. Thus, to have access to the assembly functionality, the user must create individual derived part files (described in the next section) from each body in a multi-body part file to allow those part files to be inserted into an assembly. Another reason is that multi-body part environments of the prior art are design to define static bodies in a top down fashion, not to assemble intermixed top-down and bottom-up components, and not to define how the assembly is able to be moved. Thus a multi-body part in the prior art is not an alternative to using assemblies.

Prior Art Top-Down Method Four—Derived Parts

Figure 13:
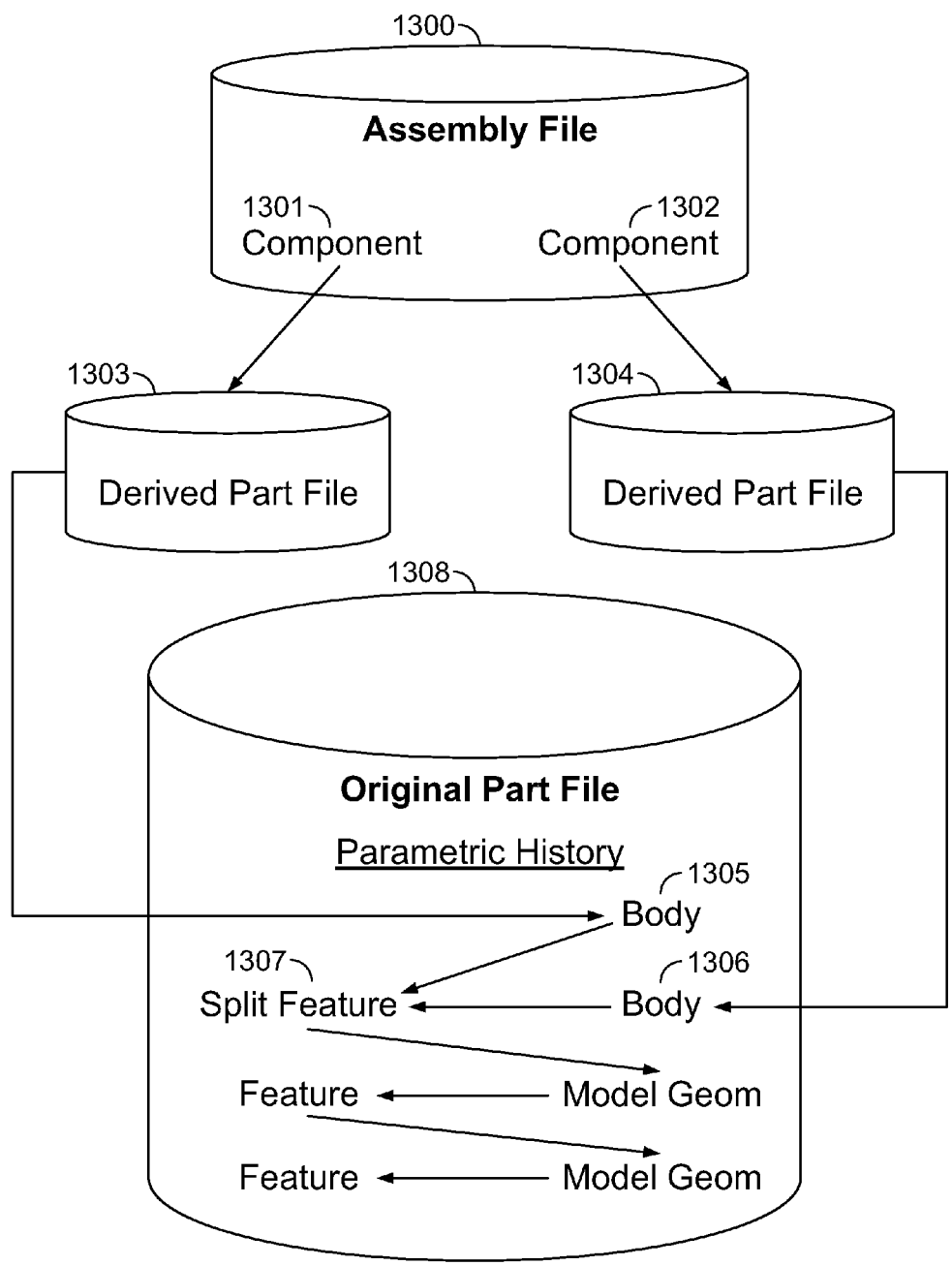
FIG. 13 illustrates the file structure of an assembly containing derived parts.

Certain feature operations, such as splitting a part into multiple pieces, naturally define one part in terms of another. Prior art commercial products create special purpose parametric features, referred to herein as derived part features, in the part or assembly environment to support these operations. In the prior art, an assembly component must be a part or another assembly, and these are defined in their own files. As a result, one derived part file needs to be generated for each body in the parent part file that the user desires to insert into an assembly as an assembly component. A derived part file is simply a part file which contains a body which is derived from another part file or assembly file based on a derived part feature. Some examples of derived part features in the prior art include: Split, Subtract, Merge, Scale, Mirror, Cavity, and Generate Assembly from Multi-body Part. The file structure (also referred to herein as a data structure) of a simple assembly containing two components from a split operation derived is shown in FIG. 13. Assembly file 1300 contains components 1301 and 1302. Each component 1301 and 1302 references derived part files 1303 and 1304, respectively. Each of these derived part files contains a parametric reference to bodies 1305 and 1306 in the original part file 1308. The bodies were generated by Split Feature 1307 in original part file 1308.

Prior Art Top-Down Method Five—Mirroring and Patterning

Often within an assembly, the same part is used many times in a pattern. In this case, there are multiple components defined from the same part. Prior art systems have assembly component patterns in which a "seed" component, which has been put in place using assembly constraints, is then duplicated using an assembly component pattern feature. This puts additional components of the original part in the right places in the assembly. A special case is an assembly mirror component feature, where the original part is mirrored into place, creating a part which is often a physically different shape than the original. In this case, a derived mirrored part must be created because the new component must point to a unique part which defines its shape. Assembly Patterns and Assembly Mirroring are implemented as assembly features, which must be executed in the assembly level parametric history as described earlier.

Aspects of an Embodiment of the Invention

Several aspects of an embodiment of the invention are described briefly below.

First, embodiments of the present invention have a single parametric Design Environment in which the user operates. The Design Environment includes all part and assembly level operations. In the prior art, there were two environments: a Part Environment and an Assembly Environment.

Second, embodiments of the present invention have a single deterministic Design History for every assembly. The Design History data structure contains the parametric features used to build the assembly. In the prior art, every part in an assembly and the assembly itself had its own parametric history, and while those histories were deterministic for pure bottom-up design, they were not deterministic for top-down design or mixed design.

Third, in embodiments of the present invention, every Design History has a Primary Design Configuration. The Primary Design Configuration defines a Primary Orientation for every component in the assembly, which is the same position that component assumes when the Design History is regenerated. The Primary Design Configuration provides the basis for making top-down and intermixed top-down and bottom-up design deterministic. Whenever parametric features are added that modify the shape of components in the assembly or add new components to the assembly, the system automatically returns to the Primary Design Configuration prior to adding the feature. This allows those parametric features to be regenerated deterministically.

Fourth, embodiments of the present invention also have a new parametric feature called the Insert Component Feature. The Insert Component Feature is a deterministic parametric feature that positions a bottom-up component (a component defined externally) in an assembly, simultaneously defining its Primary Orientation and, if it is a movable component, its movement characteristics.

Fifth, embodiments of the present invention also have a new parametric feature called the Insert Secondary Design Configuration Feature. The Insert Secondary Design Configuration Feature is a deterministic parametric feature that the user issues to record the current positions or orientations of the assembly parametrically. Subsequent features are then parametrically captured in the context of this Secondary Design Configuration in the Design History; thus, the product can be design in multiple valid configurations under the user's control.

Deficiencies of the Prior Art

In this section, several deficiencies of the prior art are described in more detail. Then it is explained how each deficiency is overcome by aspects of the present invention.

The first deficiency of the prior art is that top-down methods are not deterministically regenerated. Specifically, this includes the top-down methods of assembly features, assembly-context part features, derived parts, and assembly patterns and mirroring.

There are two reasons top-down methods are not deterministically regenerated. First, for assemblies which include movable components (which is generally the case), there is no deterministic position of the components; movable components have an infinite number of equally valid positions. This means that any feature built in the context of an assembly in one orientation will not regenerate in a deterministic way when components it parametrically referenced within that assembly are moved. It was discussed earlier that one of the requirements for a parametric feature to regenerate deterministically is that the model it references must regenerate deterministically as well. The simple example described below and shown in FIGS. 14 through 16 demonstrates that this is not the case in the prior art.

Figure 14:
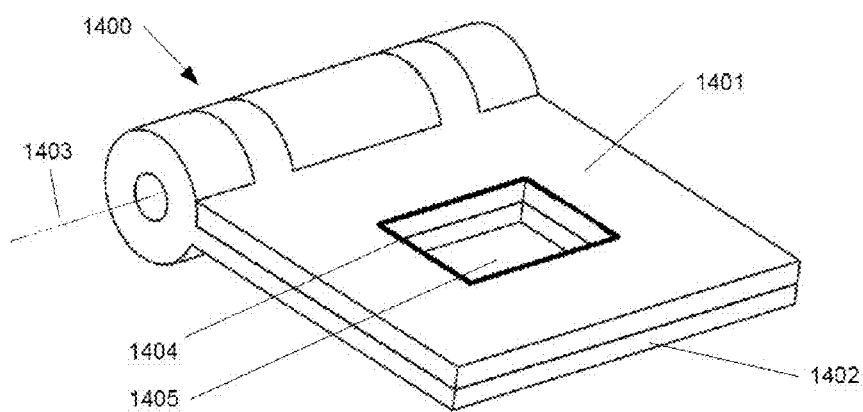
FIG. 14 illustrates the first step of an example demonstrating non-deterministic regeneration in the prior art.
Figure 15:
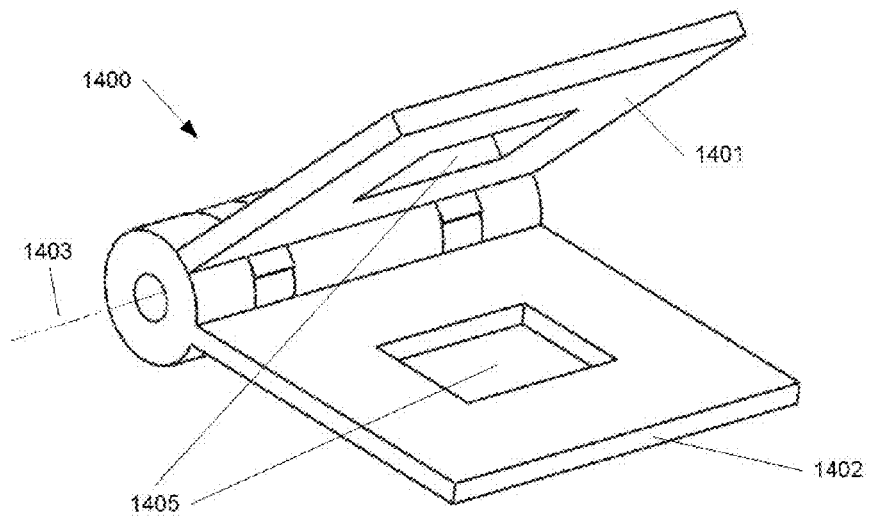
FIG. 15 illustrates the second step of an example demonstrating non-deterministic regeneration in the prior art.
Figure 16:
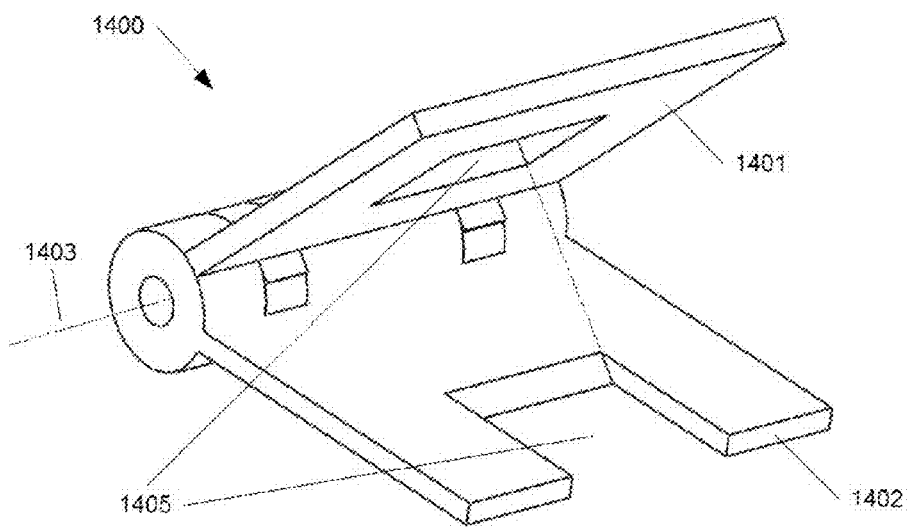
FIG. 16 illustrates the third step of an example demonstrating non-deterministic regeneration in the prior art.

In FIG. 14, the user has created a two part assembly 1400 consisting of parts 1401 and 1402, with a concentric assembly constraint between them about axis 1403. The user then drew rectangular sketch 1404 on the top face of part 1401. The user then created hole 1405 through both parts from sketch 1404. It does not matter if this was done using an assembly feature or assembly-context part features, both would exhibit the same non-deterministic behavior. In FIG. 15, the user rotates part 1401 by thirty degrees. Now the user regenerates the assembly. This results in the nondeterministic and undesired result shown in FIG. 16, where the geometry of the part 1402 has changed in an undesirable fashion. Note that hole 1405 has moved from its original position and is now slanted at a thirty degree angle relative to its entry face instead of perpendicular as originally specified and now cuts through the end of the part 1402. This is because the projection of sketch 1404 onto part 1402 has changed as a result of rotating part 1401.

The user should be able to move the components of his assembly without having those components change shape. The reason this undesired behavior occurred is that there is not one deterministic position for these two components; both zero degrees and thirty degrees are equally correct. Because there is not a deterministic position for both these components, parametric features built top down either changing both components or referencing both components cannot be relied upon to produce a deterministic result. This example demonstrates the first reason that top-down feature regeneration is not deterministic in the prior art.

The second reason that these top-down methods are not deterministically regenerated in the prior art is that when any of these top down methods is used, multiple parametric parallel histories are generated. These multiple histories have interdependencies between each other that are not synchronized. This results in a non-deterministic regeneration.

Figure 17:
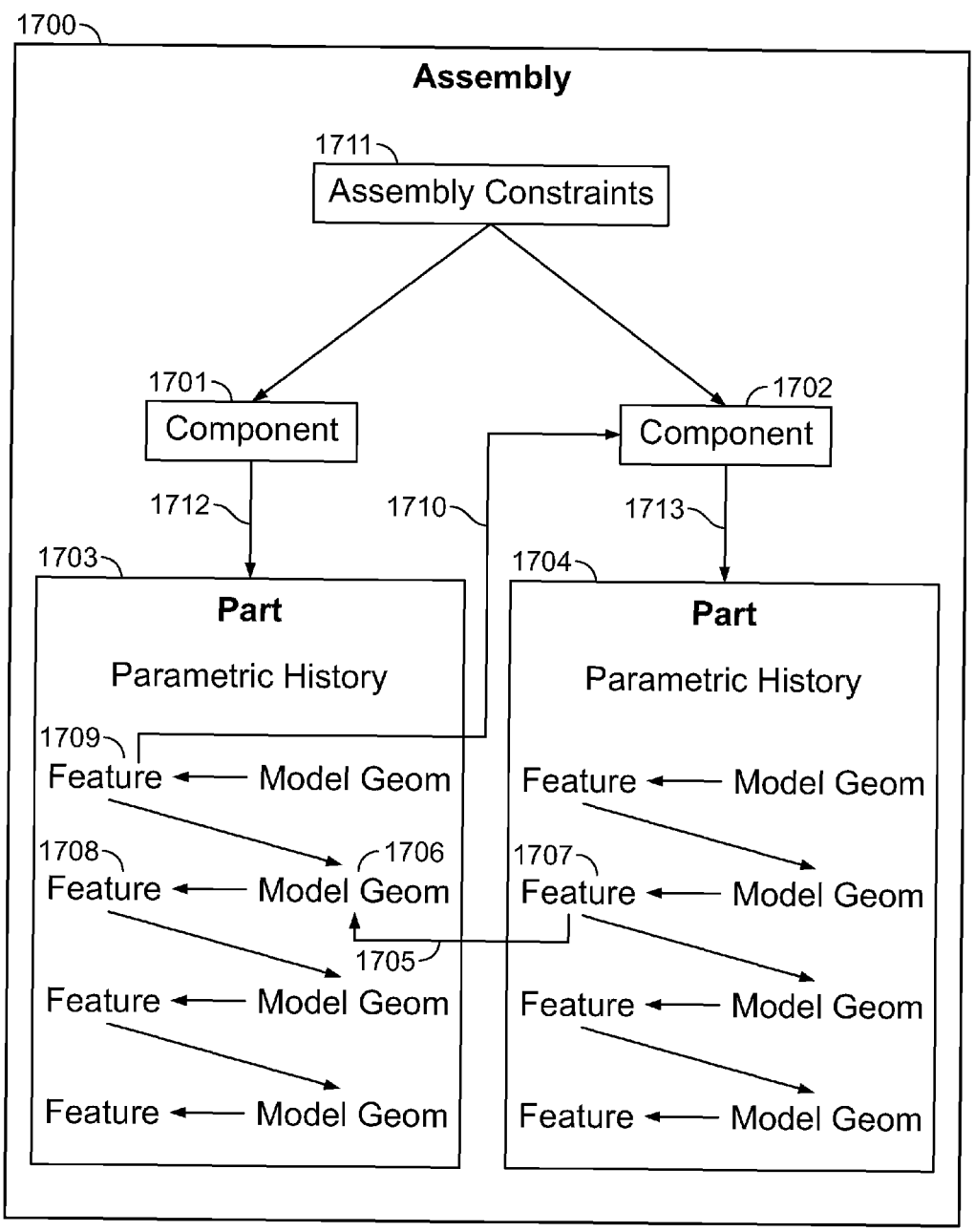
FIG. 17 illustrates unsynchronized interdependent part histories in the prior art.
Figure 18:
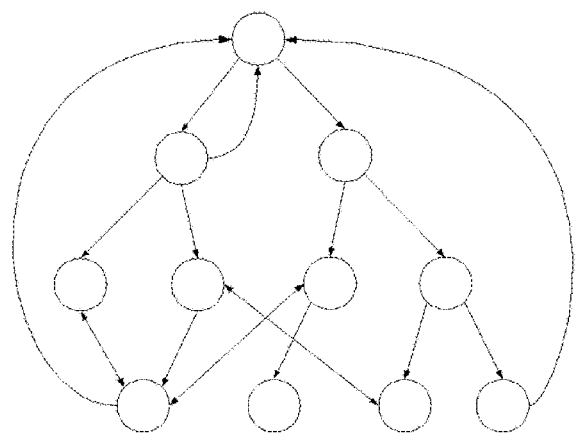
FIG. 18 illustrates a dependency graph with cycles.

These unsynchronized interdependent parametric histories are illustrated in FIG. 17. Within these part and assembly histories, there are parametric references that are dependent on both the shape of other components and also on the orientation of other components. Arrow 1705 shows an example of a shape dependency. Assembly 1700 contains components 1701 and 1702, which are defined by parts 1703 and 1704 respectively. Feature 1707 in part 1704 parametrically references and is dependent on model geometry 1706 which results from regenerating feature 1708 in part 1703. Arrow 1710 shows an example of a position dependency. Feature 1709 in part 1703 parametrically references and is dependent on the changed position of component 1702, which is only determined after regenerating all the parts and then solving the assembly constraint system 1711. However, some of the component positions can themselves be dependent on the shapes of some of the parts as shown by arrows 1712 and 1713 and those positions can be changed by the changed shapes of the parts. So component positions are dependent on part shapes, and part shapes defined using top-down parametric features are dependent on component positions. This creates cycles of dependencies as is illustrated in the dependency graph shown in FIG. 18. There is no way to turn a dependency graph with cycles into a directed graph, which is required to produce a deterministic set of steps to regenerate the assembly in one pass. Referring back to FIGS. 7 and 10, and following the dependencies represented by the arrows on those figures, it can be seen that the top-down methods available in the prior art produced parametric histories also containing cycles of dependencies, and could also not be converted to a deterministic set of steps to regenerate the assembly in one pass.

Thus it is the case in the prior art that regenerations involving top-down designs are not deterministic. In fact, it is quite possible in the prior art to create an assembly which produces a different result every time it regenerates. It is also possible to create an assembly that requires several regenerations to converge to a result. In some prior art systems, the parametric model is internally regenerated several times in the hopes that it will converge to a solution. Consequently the user cannot step through the regeneration of the entire assembly in a well defined way, as there is no single sequence of steps defined by the multiple parametric histories.

The two reasons above explain the first deficiency of the prior art, namely that top-down methods are not deterministically regenerated. This deficiency is overcome in embodiments of the present invention by two of the aspects listed earlier. First, all components, including components that can move, have a Primary Orientation that is deterministically defined and does not require solving the assembly constraint system. A top-down component's primary orientation is defined as where it is created by the first parametric feature that generates its body. A bottom-up component's primary orientation is defined by the Insert Component Feature. Second, the parametric history of an assembly is stored in one synchronized Design History, not multiple intertwined and unsynchronized parametric histories. A detailed implementation of specifying the primary orientations of top-down and bottom-up components follows below.

The second deficiency of the prior art is that it is difficult to use the prior art methods of multi-body parts and derived parts for top-down design. One reason is that to do this requires the user to create the multi-body part file, then to create a derived part file for each body, then to create an assembly file referencing each part file. This is required because in the prior art, there are separate part and assembly environments and assemblies can only directly include components that are defined as part files or other assembly files. This results in the complex file structure shown previously in FIG. 13. This file structure is difficult to manage and maintain because the parametric history related to the components are split across the original part and the derived parts. For example, moving the sketch that resulted from a Split operation could change the number of bodies that result, possibly eliminating some bodies and adding some new bodies. To reflect this in the final assembly would require the system to dynamically delete and add the appropriate derived part files and the appropriate components, and update the parametric histories appropriately. In many cases it is not clear what the user's intent is. As a result, the prior art commercial products require the user to manually correct the assemblies automatically generated from multi-body parts.

Another reason is that when multi-body parts are used to emulate an assembly, it only contains bodies that are the equivalent of top-down components, not bottom-up components. When the user desires to insert a bottom-up component in the prior art, it must be done in the Assembly Environment. Thus these components are not available in the multi-body part and cannot be referenced for top-down modeling in the multi-body part. So, multi-body parts do not provide a complete environment for top-down design. In addition, any useful body level operations that are provided to the user to operate on individual bodies in a multi-body part in the Part Environment, such as delete, pattern, mirror, set color, set attributes, hide, etc., must be duplicated for the resultant components of assemblies in the Assembly Environment. This duplication is required because not all components of the assembly (specifically bottom-up parts) are available in the multi-body part.

The second deficiency is overcome in an embodiment of the invention by eliminating the distinctions between bodies and parts that existed in the prior art. This is possible because assembly, component, part and feature operations are all available in the single Design Environment which did not exist in the prior art. The implementation of a single Design Environment depends on the second, third and fourth aspects described earlier.

Figure 19:
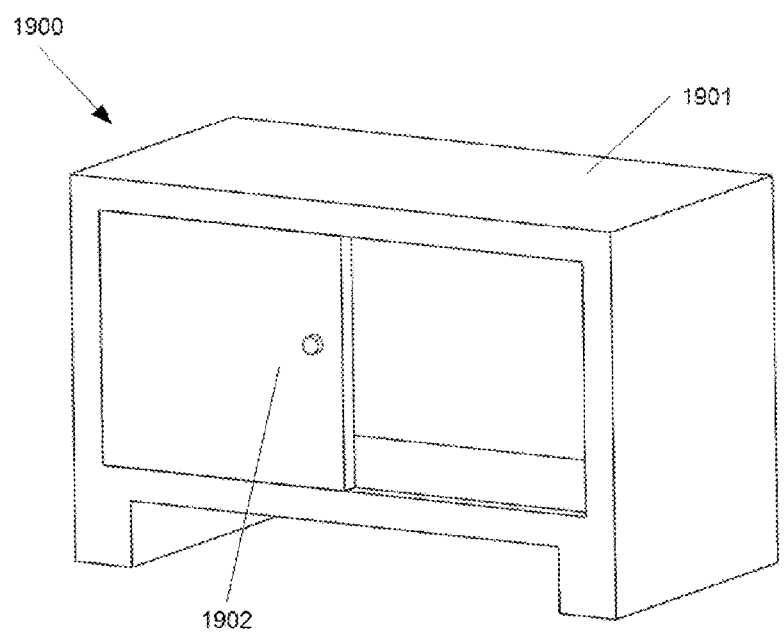
FIG. 19 illustrates a hutch and one door assembly.
Figure 20:
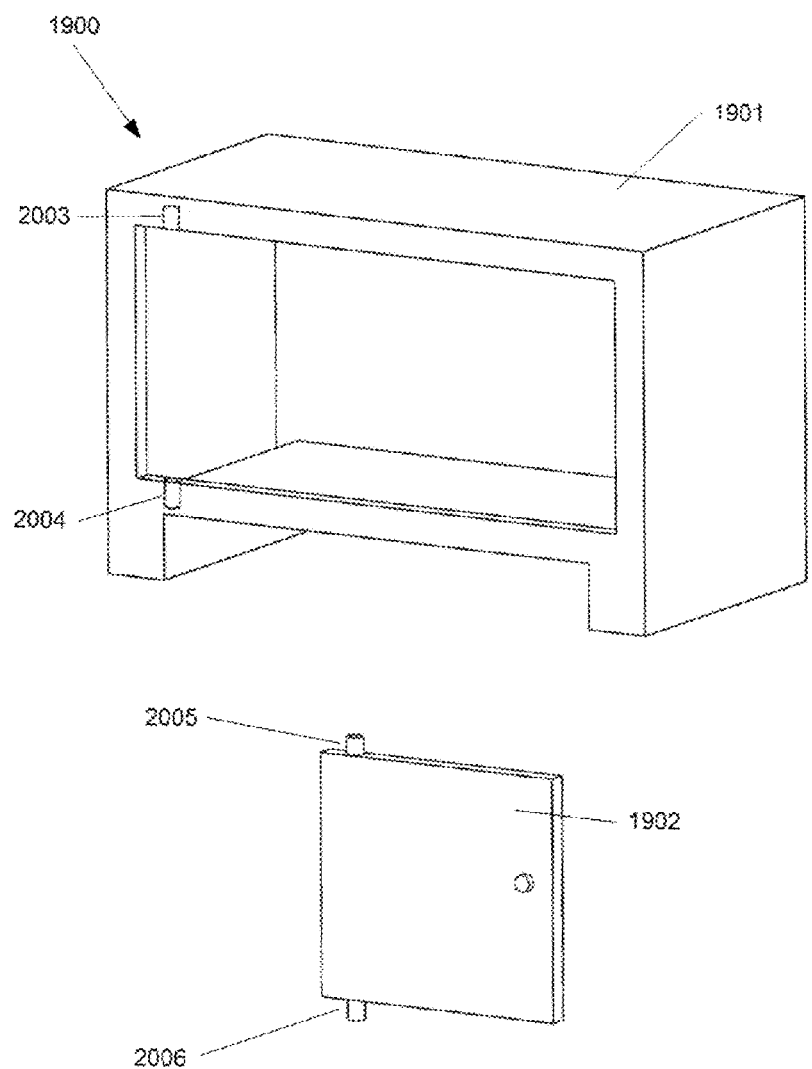
FIG. 20 illustrates an exploded view of the hutch and one door assembly.
Figure 21:
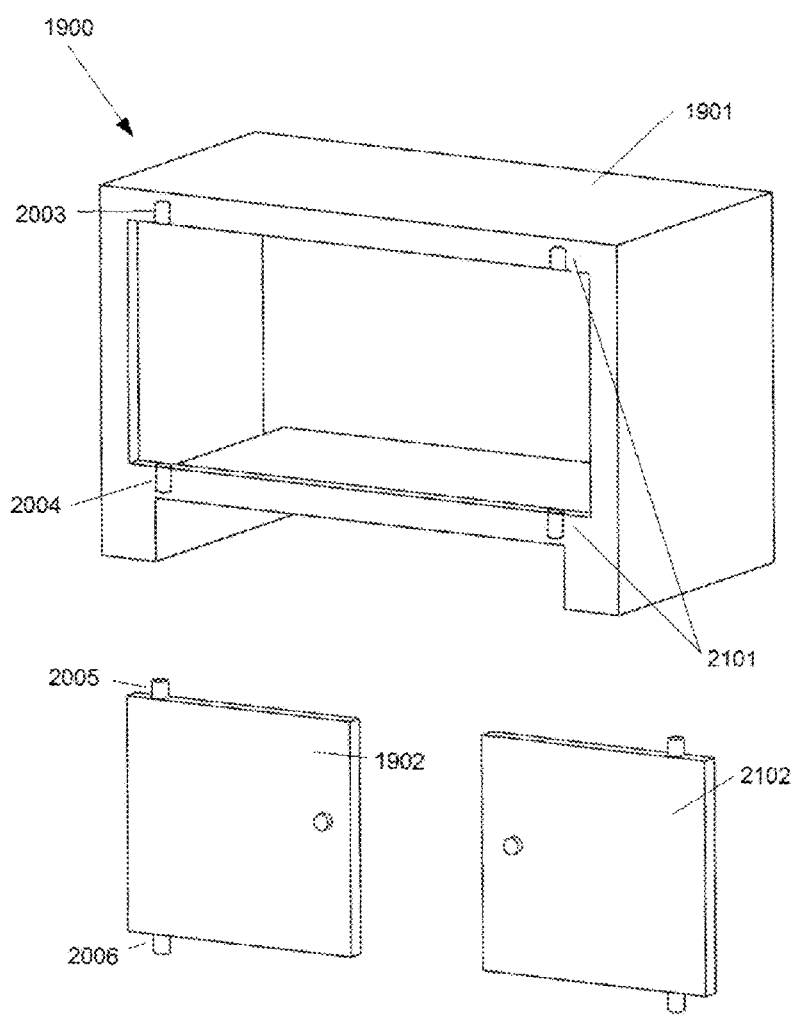
FIG. 21 illustrates an exploded view of the hutch and two doors assembly.

The third deficiency of the prior art is that an operation that make sense at both the feature level and at the component level must be implemented with duplicate parametric features in the Part and Assembly environment and executed separately at the part and assembly level to achieve the desired result. They also often require the creation of derived parts. This is because the operations must take place in the parameter history of the assembly, but they also create new uniquely shaped components. The prior art requires such uniquely shaped components to have part files, which thus requires the use of derived parts. Examples of such operations include Mirroring, Patterning, Split, etc. A Mirroring example is described below in FIGS. 19 and 20. The user has created an assembly 1900 with the hutch 1901 and door 1902 as shown in FIG. 19 and shown in an exploded view in FIG. 20. Hutch 1901 has holes 2003 and 2004, and door 1902 has pegs 2005 and 2006. Now the user wants to create the mirrored door and the mirrored holes in the hutch on the opposite side. In the prior art, it is required to mirror the holes 2003 and 2004 in hutch 1901 using a part environment Mirror Geometry operation. However, the door 1902 component only exists at the assembly level and can only be mirrored using an assembly environment Mirror Component operation. These two operations exist in distinct environments and the user is required to input both operations to regenerate in distinct unsynchronized parametric histories. FIG. 21 shows the resultant assembly, after the two operations are performed. Holes 2101 are the mirrored versions of holes 2003 and 2004 as a result of the part environment Mirror Geometry operation. Door 2102 is the mirrored version of door 1902 as a result of the assembly environment Mirror Component operation.

The third deficiency is overcome in an embodiment of the invention by replacing the distinct part and assembly environments, and the distinct part and assembly histories in the prior art with a single parametric Design Environment and a single Design History. This allows a single Mirror feature to be created that fulfills both the part level and assembly level needs. For example, a single Mirror feature can be created that mirrors part geometry, components, and even connections between components.

The fourth deficiency in commercial systems of the prior art is that these multiple overlapping top-down methodologies, each with the above-described deficiencies, are available concurrently to the user to create the same parametric models. The existence of multiple top-down methodologies, many of which can be used to build the same model, in itself makes the prior art complicated to use.

The fourth deficiency is overcome in an embodiment of the invention by providing a single top-down design methodology with a single Design History in a single Design environment. The user operates on the entire assembly utilizing this Design History in the same manner as he worked on a single bottom-up part utilizing its part parametric history in the prior art. This bottom-up methodology has proven very robust and understandable in decades of production usage as described earlier. An embodiment of the invention thus extends this robustness and understandability from parts to full assemblies.

The fifth deficiency in commercial systems of the prior art is that the existence of separate part and assembly environments is inconvenient and inefficient for the user, even for purely bottom-up designs for which these prior art commercial systems work best. Whenever the user wants to perform part modeling on multiple parts and see the effect on the assembly, he or she must activate each part to be changed, then make the changes to that part, and then regenerate the assembly to see the effect. If in that process, the user wants to change assembly constraints or any other assembly attribute, he or she must activate the Assembly Environment to do so. The prior art requires the user to switch contexts on a regular basis during the design process.

The fifth deficiency is overcome in an embodiment of the invention by providing a single Design Environment that handles all feature, component and assembly operations.

The sixth deficiency of the prior art is that top-down design and bottom up design cannot be effectively intermixed. This is because top-down design is not regenerated in the same deterministic manner as bottom-up design, as previously described.

The sixth deficiency is overcome by making both top-down design and all bottom-up design the result of deterministic feature operations used within the same Design History. Specifically, the Insert Component Feature positions each bottom-up component deterministically. All other feature operations that create new components top-down in the assembly position those components deterministically as well. An implementation of the Insert Component Feature is described in detail below.

Implementation of Top-Down Design

A top-down component is one that is created from scratch in the context of the assembly. When designing a new top-down component, the initial position of that component is simply where it is originally built. That initial position is fully determined by the Design History. Specifically, it is determined by the parametric feature that first creates its body. This initial position is used to define the Primary Orientation of the top down component in an embodiment of the present invention.

In embodiments of the present invention, the top-down component can be connected to other components in a manner that either allows movement, by using a Moving Connection, or does not allow movement, by using a Rigid Connection. The resultant set of Connections defines an Assembly Constraint System which dictates the allowable movement of the assembly. Thus the same Design Environment is used to define the shape, orientations and allowable movement of the components of the assembly. This differs from the prior art, where the part environment and sometimes the assembly environment were used to define the shape of the components, and only the assembly environment was used to define the orientations and movement of the components of the assembly.

In embodiments of the present invention, when the user moves the components of the assembly into positions that are different than the Primary Design Configuration, the program puts the assembly in a Current Viewing Configuration, while maintaining the Primary Design Configuration. Whenever the user wants to apply an additional modeling or modification feature, the assembly is automatically put back into the Primary Design Configuration, using the PutAssemblyInPrimaryDesignConfig algorithm described below. The state of the assembly is then exactly the same as the state that would be produced by regenerating the Design History. Thus the Design History is fully deterministic, and will always produce the same assembly in the same Primary Design Configuration. When the parameters of the assembly are modified, or the Design History itself is modified, the resultant regenerated assembly will always be as if the user had built the assembly from scratch with those parameters. As described previously, this behavior is one of the powerful strengths of parametric part modeling in the prior art. Thus an embodiment of the invention extends the robustness of parametric part modeling to full parametric top-down assembly modeling.

In the embodiment of the present invention described below, the Primary Design Configuration is defined by a specific Primary Orientation for every component in the assembly that is produced by regenerating the assembly. An orientation is represented using a 4×4 transformation matrix data structure (called a "Matrix" in the pseudo-code below), which is well known to those of ordinary skill in computer graphics software and algorithms. The matrix describes how the component is transformed from its own space into a position in assembly space. A special case of a transformation matrix is an identity matrix. A component with an identity matrix would indicate the 3D space in which the component is defined is identical to the 3D space in which the assembly is defined.

The Primary Design Configuration is represented by the following data structures. Only the relevant fields to this discussion are shown.

```
// copyright 2008, LCDesign, Inc.
// data structure for a component
Class Component
{
    Body body;                  // the body referenced
    Matrix viewingOrientation;  // the currently viewed orientation
                                // of the component
    Matrix primaryOrientation;  // the orientation of the component
                                // in the
                                // PrimaryDesignConfiguration
    ...
}
// data structure for an assembly
Class Assembly
{
```

-continued

```
    List<Component> components;    // all components in this assembly
    DesignHistory designHistory;   // the design history of this
                                    assembly
    ...
}
```

The primaryOrientation field of the Component data structure above holds the transformation matrix specifying the orientation for that component in the assembly that is produced by regenerating the assembly to which that component belongs. The set of these Primary Orientations for every component in the assembly defines the Primary Design Configuration.

The viewingOrientation field of the Component data structure holds the transformation matrix specifying the position of that component in the assembly as currently seen by the user. The component is always viewed through the current viewing orientation.

The present invention is able to determine if the assembly is in the Primary Design Configuration any time the user wants to apply an additional parametric feature or edit an existing parametric feature. If it is not, the assembly is returned to the Primary Design Configuration. By so doing, the additional feature operations are always recorded in the Design History data structure based on the Primary Design Configuration. Since the parametric features are deterministic, and the Primary Design Configuration is the deterministic result of regenerating the parametric features, the entire top-down assembly is deterministically regenerated.

Figure 22:
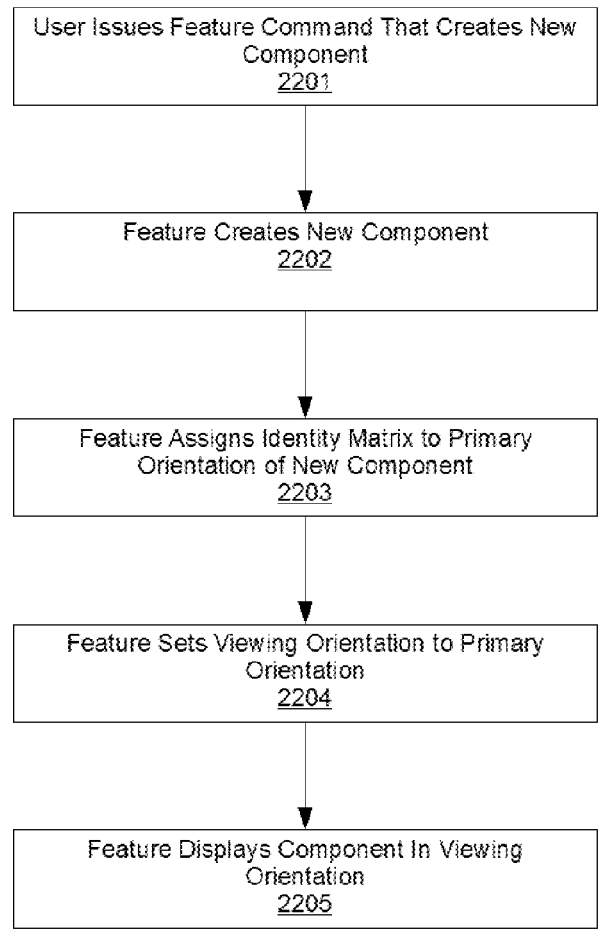
FIG. 22 describes how the primary orientation of a top-down component is created, according to one embodiment of the present invention.

The flowchart in FIG. 22 describes how the primary orientation of a top-down component is created. In step 2201, the user issues any feature command that creates a new component 2202 in the assembly. An example of such a feature command is an Extrude feature when it is used to extrude a sketch into a new component. By definition, this component is a top-down component, because it is created from scratch in the assembly. In step 2203, the feature assigns a 4×4 identity matrix to the "primaryOrientation" field of the component. This indicates that the component was defined directly in the space of the assembly. The Primary Design Configuration for the assembly is simply the set of Primary Orientations for each component in the assembly. When a top-down component is created by a feature, the feature sets its "viewingOrientation" field to its "primaryOrientation" field in step 2204. The feature then displays the top-down component in its Viewing Orientation in step 2205. The user may choose to define Connections between the top-down components that define the movement characteristics of those components. The user may also move a component in an unconstrained manner. Whenever a component is moved, its new position will be assigned to its "viewingOrientation" field. Thus, while the user is seeing the component in a different Viewing Orientation, its Primary Orientation is retained.

Figure 23:
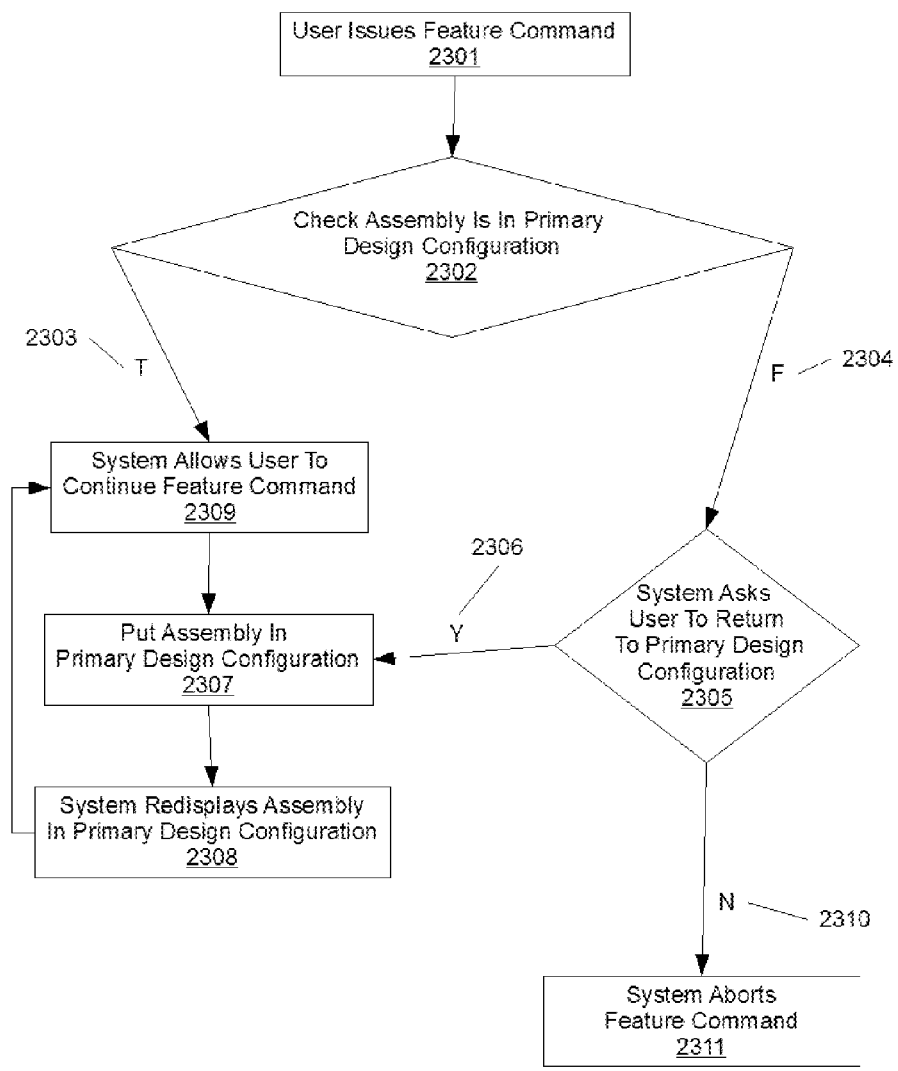
FIG. 23 shows the process that a CAD system would employ to ensure the assembly is in its Primary Design Configuration, according to one embodiment of the present invention.

FIG. 23 shows the process that a system employing an embodiment of the invention would use when the user issues a feature command to ensure the assembly is in its Primary Design Configuration. In step 2301, the user issues a feature command. The system then must determine if the assembly is already in the Primary Design Configuration. To do so, an embodiment of the present invention executes the CheckIfAssemblyIsInPrimaryDesignConfig routine 2302. This simply cycles through each component in the assembly and compares the current orientation to the primary orientation, as shown in pseudo-code below.

```
// copyright 2008, LCDesign, Inc.
Bool CheckIfAssemblyIsInPrimaryDesignConfig(Assembly assemblyIn)
{
    Foreach (Component thisComponent in assemblyIn.components)
    {
        If (thisComponent.primaryOrientation !=
            thisComponent.viewingOrientation)
            return FALSE;
    }
    return TRUE;
}
```

If the system is not in the Primary Design Configuration, CheckIfAssemblyIsInPrimaryDesignConfig 2302 returns FALSE (2304), otherwise it returns TRUE (2303).

If it returns TRUE (2303), the system allows the user to continue with the feature command (step 2309). If it returns FALSE (2304), the system asks the user if he or she wants to put the system back into the Primary Design Configuration (step 2305).

If the user answers Yes (2306), the system executes the PutAssemblyInPrimaryDesignConfig algorithm 2307 described in pseudo-code below. This algorithm simply sets the current configuration of every component to its primary configuration.

```
// copyright 2008, LCDesign, Inc.
Void PutAssemblyInPrimaryDesignConfig(Assembly assemblyIn)
{
    Foreach (Component thisComponent in assemblyIn.components)
    {
        thisComponent. viewingOrientation =
            thisComponent.primaryOrientation)
    }
    return;
}
```

In step 2308, the system then redisplays the assembly so it appears in the Primary Design Configuration. In step 2309, the system allows the user to continue with his modeling feature. If the user answers No (step 2310), the system aborts the feature command (step 2311).

Figure 24:
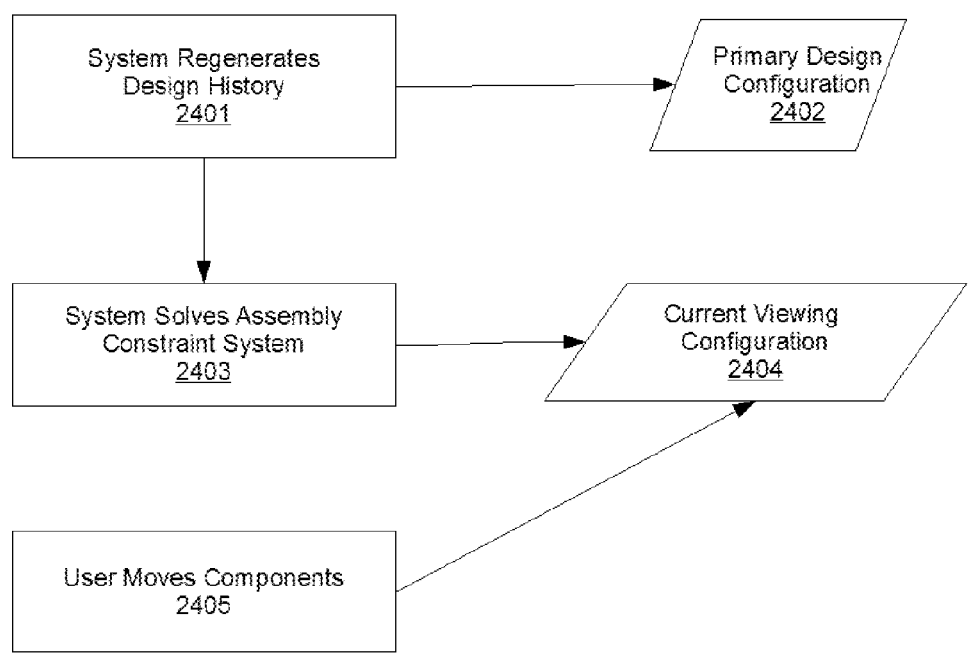
FIG. 24 illustrates a full regeneration, according to one embodiment of the present invention.

The Assembly Constraint System defined by Connections is independent of the Design History. A full regeneration is depicted in FIG. 24. First, in step 2401, the system regenerates the Design History, producing the Primary Design Configuration 2402. At this stage, the shapes and the Primary Orientations of all of the components of the assembly are finalized. Then, in step 2403, the system solves the Assembly Constraint System to produce the Current Viewing Configuration 2404. This step changes only the Viewing Orientation of the components. It cannot change the shapes or the Primary Orientations of the components, and thus does not interfere with the deterministic nature of the Design History. The user can also move the assembly components around at will as shown in step 2405. This also affects only the Viewing Orientations in the Current Viewing Configuration 2404, not the Primary Orientations in Primary Design Configuration 2402.

To summarize, the Design History produces the Primary Orientations that define the Primary Design Configuration. The Assembly Constraint System, which defines the realistic movement of the assembly and alternate positions for the assembly, changes only the Viewing Orientations, which define the Current Viewing Configuration. Thus the components of the assembly are allowed to be moved at will, either in a realistic constrained manner based on the Assembly Constraint System, or in an unconstrained manner, and the Design History and Primary Design Configuration are not disturbed. Whenever the user wants to add or edit parametric features, the CAD system employing the present invention resets the assembly to its Primary Design Configuration, thus ensuring deterministic regeneration. This is in stark contrast to the prior art, where changing the positions of components could change the results of regeneration.

Thus far it has been described how the user can define an assembly in a single Primary Design Configuration that can be parametrically regenerated. It has also been described how the user can define an Assembly Constraint System that allows the user to put the assembly in another valid configuration, referred to as the Current Viewing Configuration or secondary orientation. It would be a useful additional capability if the user was able to also do parametric design in such other valid configurations.

To provide that capability, some embodiments of the invention add a deterministic Insert Secondary Design Configuration Feature to the set of parametric features of the CAD system. The Insert Secondary Design Configuration Feature parametrically records the Current Viewing Configuration as a Secondary Design Configuration by recording (storing) the current values of the Preferred Positions of the Connections in the Current Viewing Configuration. If several Secondary Design Configurations are defined, each is stored independently and generally referred to as secondary orientations. The Insert Secondary Design Configuration Feature is placed in the Design History when the user issues it. Subsequent features issued by the user are then recorded against the Secondary Design Configuration. On regeneration, when the Insert Secondary Design Configuration Feature is regenerated, it feeds the Preferred Positions to the Assembly Constraint System to make the assembly reassume the Secondary Design Configuration. Subsequent features then regenerate in that configuration. Thus, during regeneration, only one design configuration is active during the regeneration of each feature. The user can force the assembly to reassume the Primary Design Configuration and again use that as the design configuration after having used a Secondary Design Configuration as well.

Figure 26:
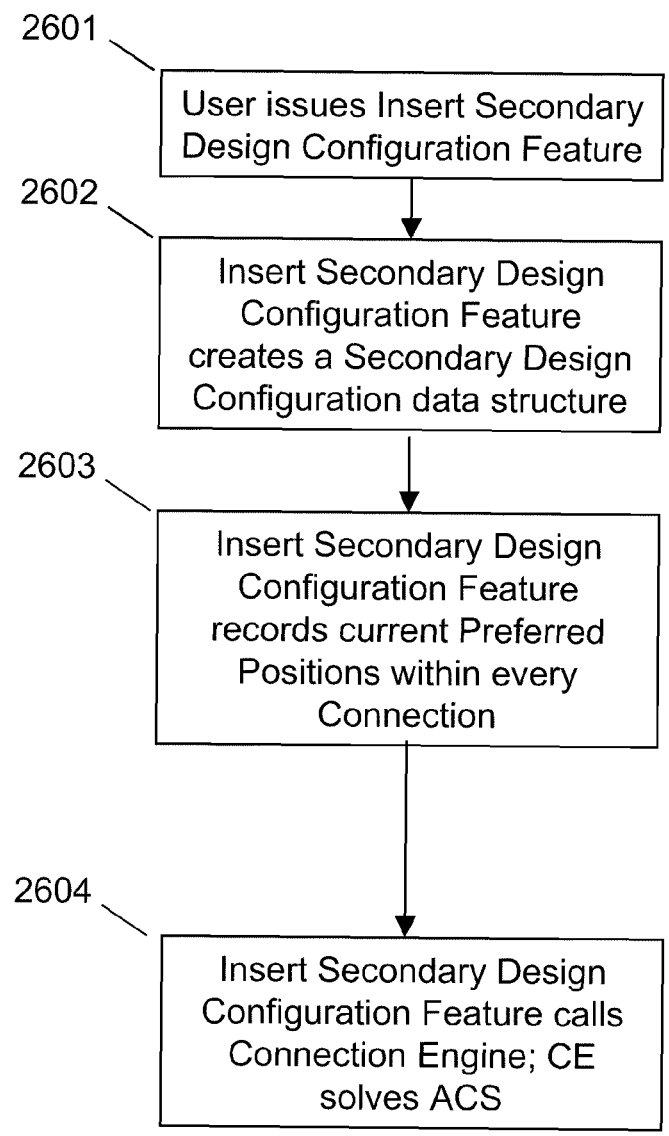
FIG. 26 describes the process used within the Insert Secondary Design Configuration Feature, according to one embodiment of the present invention.

The flowchart in FIG. 26 describes the process within the Insert Secondary Design Configuration Feature. In step 2601, the user issues the Insert Secondary Design Configuration Feature. In step 2602, the Insert Secondary Design Configuration Feature creates a Secondary Design Configuration data structure. In step 2603, the Insert Secondary Design Configuration Feature records the current Preferred Positions within every Connection in the Secondary Design Configuration data structure. In step 2604, Insert Secondary Design Configuration Feature solves the Assembly Constraint System (ACS) by calling Connection Engine (CE) 510 with the current Preferred Positions to ensure that it reproduces the Current Viewing Configuration as expected.

Figure 27:
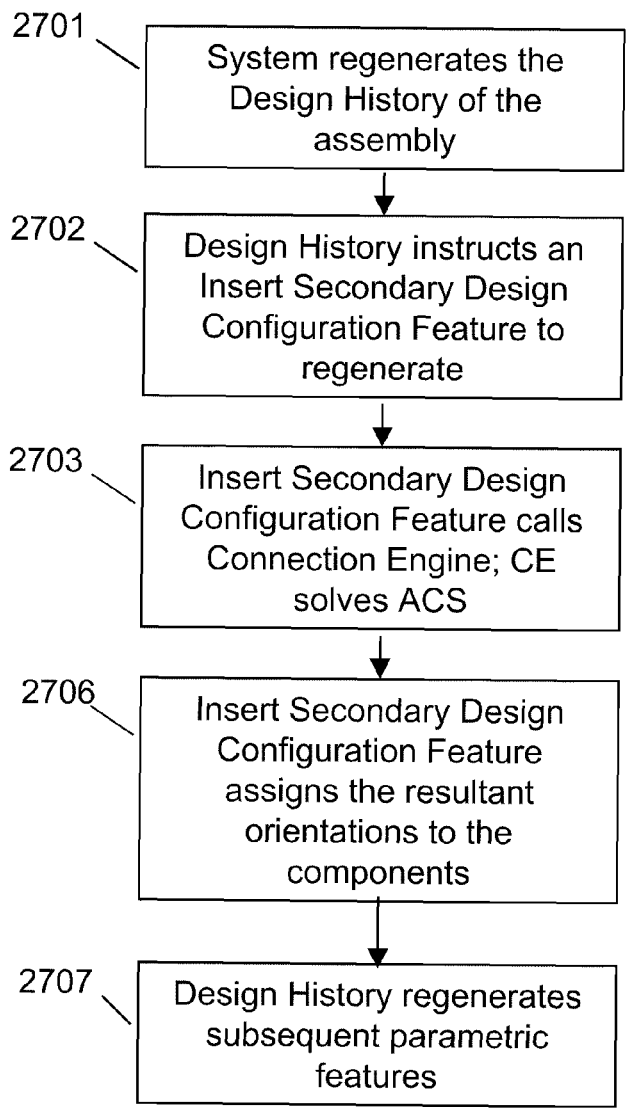
FIG. 27 describes the process executed on the regeneration of an Insert Secondary Design Configuration Feature during a parametric regeneration of the assembly, according to one embodiment of the present invention.

The flowchart in FIG. 27 describes the process that is executed on the regeneration of an Insert Secondary Design Configuration Feature during a parametric regeneration of the assembly. In step 2701, the CAD system regenerates the Design History of the Assembly. In step 2702, the Design History instructs an Insert Secondary Design Configuration Feature to regenerate. In step 2703, the Insert Secondary Design Configuration Feature calls Connections Engine 510 inputting its stored Preferred Positions. Connection Engine 510 (referring to FIG. 5) solves the Assembly Constraint System and returns the resultant orientations of the components to the Insert Secondary Design Configuration Feature.

In step 2706, the Insert Secondary Design Configuration Feature assigns the resultant orientations to the components. In step 2707, the Design History proceeds to regenerate subsequent parametric features, which are now executed against the components in the resultant orientations.

The Secondary Design Configuration Feature can choose to provide more weight to some Preferred Positions than other. This weighting can help avoid over-constrained situations on regeneration of the Insert Secondary Design Configuration Feature. For example, those Preferred Positions that have been specifically set to that value by the user as opposed to simply set to that value as a by-product of solving the Assembly Constraint System could be weighted more heavily. Similarly the Secondary Design Configuration Feature could choose to provide more weight to those Preferred Positions that are related to components that are referenced or modified by subsequent parametric features in the Design History that are dependent on that secondary Design Configuration.

Thus the user has the ability, within a single environment, to define a full top-down assembly parametrically, to put the assembly in any orientation, and to redefine the connection scheme, with no impact on the deterministic regeneration of the assembly. None of these capabilities exist in the prior art. In the following section, it will be shown that this same mechanism is extended to include bottom-up design.

Bottom-up Design and Mixed Design

Bottom-up design occurs when one component with its own Design History is inserted into an assembly with a separate and independent Design History. In a pure bottom-up design, a component inserted bottom-up is never referenced for further shape modeling; it is only referenced for positioning. Regeneration of a pure bottom-up design is handled in embodiments of the invention in the same way as in the prior art, which is fully deterministic and described in detail above, referencing FIGS. 1 and 2. As in the prior art, the Design Histories of the bottom-up components are regenerated first to update the shapes of the bottom-up components, and then the positions of the bottom-up components in the assembly are determined.

However, as was also previously noted, prior art methods of mixed top-down and bottom-up design are not deterministically regenerated in the prior art. This is in stark contrast to the present invention, in which all components are positioned deterministically by the Design History, so that any subsequent parametric features that reference them or modify them will be deterministic as well. The following describes how deterministic positioning is also achieved for bottom-up components in embodiments of the present invention by the introduction of the Insert Component Feature.

As noted above, the Design History consists of a sequence of deterministic parametric features, which, when regenerated, produces a deterministic assembly. Each top-down component's Primary Orientation is defined by the feature that first created the body of that component. In an embodiment of the invention, a deterministic Insert Component Feature is added to the set of parametric features of the CAD system to insert and position bottom-up components in the assembly. Within the Insert Component Feature, the user specifies two things. First, the user identifies the existing bottom-up part or subassembly to be inserted into the assembly as a new component. Second, the user positions the bottom-up component by defining a Connection and a Preferred Position for the Connection. The Preferred Position of the Connection defines the Primary Orientation of the bottom-up component. Like the Primary Orientations of top-down components, the bottom-up component's Primary Orientation is fully deterministic, meaning it results in one and only one position of the new component relative to the existing components as defined by the parametric feature that first introduced it to the assembly. Unlike the Primary Orientation of top-down components described earlier, the Primary Orientation of a bottom-up component may be any valid transformation matrix as defined by the preferred position of the connection, not just an identity matrix. In fact, it typically is not an identity matrix.

The Insert Component Feature, like any other parametric feature, can only be used when the assembly is in its Primary Design Configuration. If the assembly is not in its Primary Design Configuration, the system will go through exactly the same steps described earlier and illustrated in FIG. 23 to put the assembly back into the Primary Design Configuration. Thus, the parametric features that generate top-down and bottom-up components are deterministic, producing components in Primary Orientations deterministically. The shapes and positions of all components of an assembly are fully defined by the deterministic Design History of the assembly, and those positions define the Primary Design Configuration of the assembly.

Figure 25:
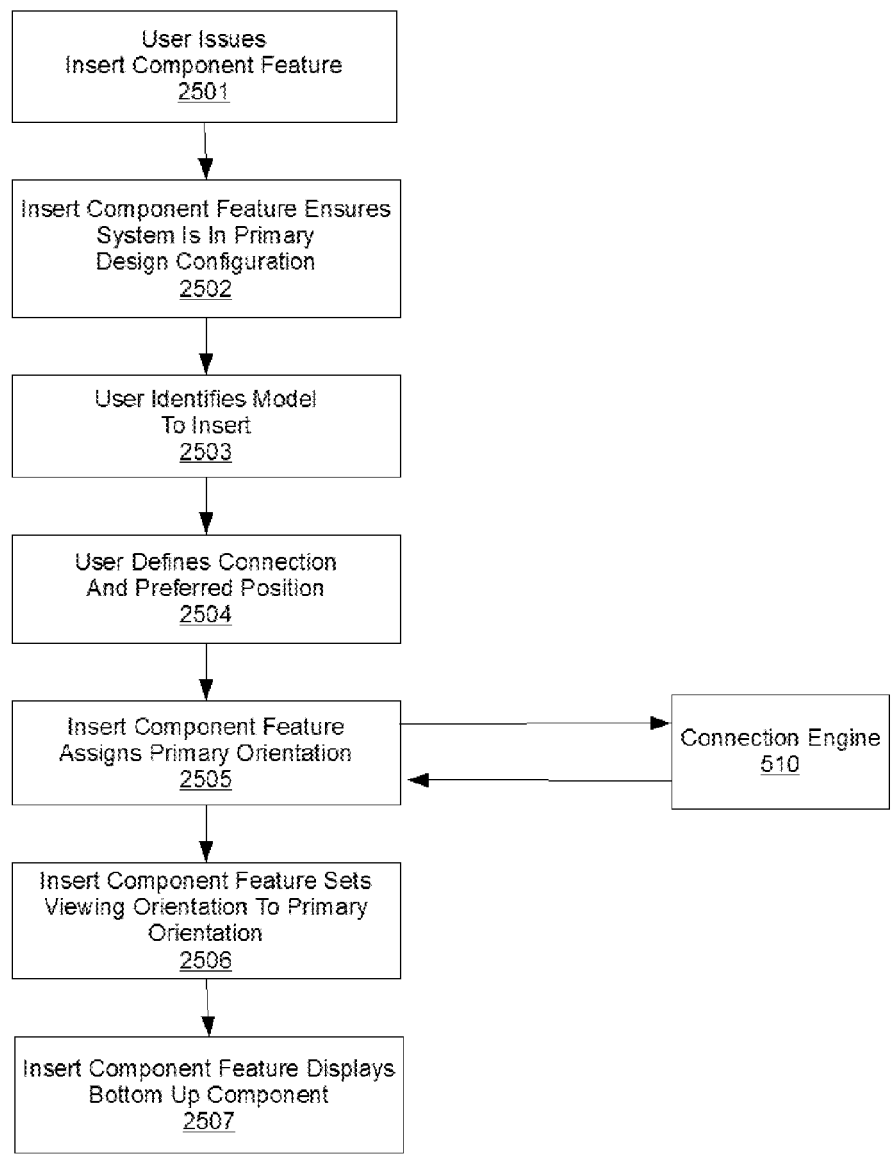
FIG. 25 describes the process used within the Insert Component Feature, according to one embodiment of the present invention.

The flowchart in FIG. 25 describes the process within the Insert Component Feature that creates the bottom-up component and its Primary Orientation. In step 2501, the user issues the Insert Component Feature. In step 2502, the Insert Component Feature goes through the steps described previously in FIG. 23 to ensure the system is in the Primary Design Configuration. In step 2503, the user identifies the part or subassembly to insert. In step 2504, the user defines the Connection and Preferred Position between the Component to insert and the rest of the assembly using Connection Engine 510 (described above). Connection Engine 510 processes the Connection and Preferred Position to produce the transformation matrix defining the orientation of the bottom-up component, which is returned to the Insert Component Feature. In step 2505, the Insert Component Feature then assigns that transformation matrix to the inserted component's primaryOrientation field. In step 2506, the Insert Component Feature sets the viewingOrientation field of the component to its primaryOrientation field. In step 2507, the Insert Component feature displays the bottom-up component to the user in the Viewing Orientation. The Primary Orientation is defined using only the single Connection used to position the bottom-up component and that Connection's Preferred Position, both as specified by the user. As a result, the Primary Orientation of the bottom-up component is also independent of the Assembly Constraint System.

Thus all components in the assembly whether defined bottom-up or top-down are the result of a deterministic parametric feature recorded in the same Design History and are reflected in the Primary Design Configuration and the Current Viewing Configuration in exactly the same manner. As a result, all subsequent parametric features applied in the assembly that reference or modify existing components are fully deterministic, independently of whether those components were created top-down or bottom-up. This includes creating additional top-down components from scratch referencing existing top-down or bottom-up components, and inserting additional bottom-up components using the Insert Component Feature referencing existing top-down or bottom-up components. It also includes using top-down parametric features (also referred to as modification features) to modify the shapes of existing components, whether they were originally created in place in a top-down manner, or inserted in a bottom-up manner. Thus, a component which was originally a bottom-up component can later subsequently be modified in a top-down manner in the assembly.

As discussed above, a set of Connections is used define the Assembly Constraint System for an assembly of top-down components. In fact, to the Assembly Constraint System, all components are the same, whether they were defined top-down or bottom-up. So Connections are also used to define the Assembly Constraint System for bottom-up components. The Assembly Constraint System is therefore independent of whether the components were defined top-down, bottom-up, or a mixture of both.

Thus the present invention allows unrestricted intermixing of top-down and bottom-up design in a fully parametric and deterministic manner. The resulting assembly can be parametrically edited in exactly the same manner and with the same robustness as a bottom-up part in the prior art.

Synergy with Connections

In an embodiment of the invention, the same Connection Engine that is used within the Insert Component Feature to define the primary orientation of a bottom-up component is also used to define the Assembly Constraint System of the entire assembly. For convenience, the same Connection object that was used to position the bottom-up component can be reused in defining the Assembly Constraint System, thus saving the user the need to re-specify it. This is a convenience only and does not restrict the ways in which the Assembly Constraint System can be defined. In fact, the user could also be allowed to define the Primary Orientation of the bottom-up component with one Connection and to use different Connections or no Connections at all to define its valid positions and allowable movement within the Assembly Constraint System. Accordingly, the present invention is not limited as to how the Assembly Constraint System is defined.

Because each top-down component is built in place, no connection is needed to define the Primary Orientation of a top-down component. However, the user will generally still choose to define a Connection between a top-down component and another component in the assembly in order to specify the movement behavior of the assembly. In such a case, it is still more convenient to define the movement behavior of the top-down component using an embodiment of the present invention than it was in the prior art. This is because information can be inferred from the top-down component based on the position in which it is built.

Consider the hutch assembly example shown in FIG. 19. Assume the user started with the hutch component 1901 in assembly 1900. The user then created door component 1902 top-down, referencing hutch component 1901 as he or she did so. At this stage the user decides he or she wants the two components to be rigidly connected. The user selects the two components and instructs the system to rigidly connect them. Because they were built in the correct relative orientation as shown in FIG. 19, the user need not specify any further information. In the prior art, to create the same rigid attachment between the two components, the user would typically have had to define three assembly constraints, each of which would involve selecting two aligned faces or edges. Thus an embodiment of the invention reduces the amount of user interaction required to achieve the same result when the components are built top-down in the correct orientation.

Similarly, if the desired movement behavior was rotating rather than rigid, the user would only have to select the two parts and indicate the axis of rotation on one of the parts. Contrast this to the prior art, in which he or she would have had to select both parts and add two assembly constraints, each of which would have required selecting geometry from each part.

Finally, it is often the case that moving components in assemblies have restricted movement. For example, the door of the hutch above would typically rotate from its closed position to a specific end position; it would not rotate 360 degrees. In such a case, the CAD system of the present invention supports the ability to define positions that define the limits of movement within the Assembly Constraint System. It is also often the case that a top-down component built in place is built in one of those limiting positions. Thus the user can just instruct the system to use the as built position of the top-down component as one of the limiting positions—again providing a step-saving convenience to the user.

Alternate Embodiments

The data reflecting the CAD model of the assembly, and all of its sub-assemblies, components, parts, connections, features, movement characteristics, and orientations can be stored in any data structure currently known in the computing arts or yet to be invented. This data may be in a single file on a single disk, in multiple files, and/or stored in multiple physical or virtual locations, without limitation, as data is known to be represented and stored now or in the future. In particular, although a design history or model data structure is described, those of ordinary skill in the art will recognize that any memory organization and/or file structure containing the described design data may be used. The design history, features, components, and/or movement characteristics, without limitation, may be stored in any form or location. Accordingly, implementations are not limited in how or where the data representing the CAD design of the assembly, its constituent parts, and/or model(s) thereof are stored.

The order in which the steps of the present method are performed is purely illustrative in nature. In fact, the steps can be performed in any order or in parallel, unless otherwise indicated by the present disclosure.

The method of the present invention may be performed in either hardware, software, or any combination thereof, as those terms are currently known in the art. In particular, the present method may be carried out by software, firmware, and/or microcode operating on a computer or computers of any type, configuration, or manufacture. Additionally, software embodying the present invention may comprise computer instructions in any form (e.g., source code, object code, and/or interpreted code, etc.) stored in any data structure and/or on a computer-readable medium (e.g., ROM, RAM, magnetic media, punched tape or card, compact disc (CD), and/or digital versatile disc (DVD), etc.). Furthermore, such software may also be in the form of a computer data signal embodied in a carrier wave, such as that found within the well-known Web pages transferred among devices connected to and with computer networks, such as the Internet. Accordingly, the present invention is not limited to any particular platform, unless specifically stated otherwise in the present disclosure.

We claim:

1. A computer-implemented method comprising:
   receiving input defining one or more first parametric features arranged in a first order to create a bottom-up component in an assembly;
   adding the first parametric features to a shared design history according to the first order, and wherein a first parametric feature of the first order defines a respective primary orientation of the bottom-up component in the assembly;
   receiving input defining one or more second parametric features arranged in a second order to create a top-down component in the assembly;
   adding the second parametric features to the shared design history according to the second order and following the first parametric features in the shared design history wherein a first parametric feature of the second order defines a respective primary orientation of the top-down component in the assembly, and wherein one or more of the second parametric features reference the bottom-up component in the respective primary orientation of the bottom-up component;
   receiving input to position the bottom-up component to create a respective secondary orientation of the bottom-up component in the assembly;
   after receiving the input to position the bottom-up component, receiving input defining one or more third parametric features of the top-down component arranged in a third order wherein at least one of the third features references the bottom-up component in the respective primary orientation of the bottom-up component;
   adding the third parametric features to the shared design history according to the third order and following the second parametric features in the shared design history; and
   generating a model by executing the parametric features of the shared design history according to the order of the parametric features in the shared design history; and
   wherein the method is implemented by one or more processors.

2. The method of claim 1, further comprising:
   adding one or more parametric features to capture the respective secondary orientation of the bottom-up component to the shared design history following the third parametric features.

3. The method of claim 1 wherein generating the model by executing the parametric features of the shared design history according to the order of the parametric features in the shared design history comprises:
   executing the first parametric features to create the bottom-up component in the respective primary orientation of the bottom-up component; and
   after executing the first parametric features, executing the second parametric features to create the top-down component in the respective primary orientation of the top-down component.

4. The method of claim 1 wherein each parametric feature is an extrusion, a cut, a fillet, a sketch, a shell, or a position in the assembly.

5. The method of claim 1 wherein the parametric features of the shared design history do not create any cycles during the execution of the parametric features of the shared design history.

6. A system comprising:
   one or more computer programmed to perform operations comprising:
   receiving input defining one or more first parametric features arranged in a first order to create a bottom-up component in an assembly;
   adding the first parametric features to a shared design history according to the first order, and wherein a first parametric feature of the first order defines a respective primary orientation of the bottom-up component in the assembly;
   receiving input defining one or more second parametric features arranged in a second order to create a top-down component in the assembly;
   adding the second parametric features to the shared design history according to the second order and following the first parametric features in the shared design history wherein a first parametric features of the second order defines a respective primary orientation of the top-down component in the assembly, and wherein one or more of the second parametric features reference the bottom-up component in the respective primary orientation of the bottom-up component;

receiving input to position the bottom-up component to create a respective secondary orientation of the bottom-up component in the assembly;

after receiving the input to position the bottom-up component, receiving input defining one or more third parametric features of the top-down component arranged in a third order wherein at least one of the third features references the bottom-up component in the respective primary orientation of the bottom-up component;

adding the third parametric featured to the shared design history according to the third order and following the second parametric features in the shared design history; and generating a model by executing the parametric features of the shared design history according to the order of the parametric features in the shared design history.

7. The system of claim 6, wherein the operation further comprise:

adding one or more parametric features to capture the respective secondary orientation of the bottom-up component features to capture the respective secondary orientation of the bottom-up component to the shared design history following the third parametric features.

8. The system of claim 6 wherein generating the model by executing the parametric features of the shared design history according to the order of the parametric features in the shared design history comprises:

executing the first parametric features to create the bottom-up component in the respective primary orientation of the bottom-up component; and after executing the first parametric features, executing the second parametric features to create the top-down component in the respective primary orientation of the top-down component.

9. The system of claim 6 wherein each parametric feature is an extrusion, a cut, a fillet, a sketch, a shell, or a position in the assembly.

10. The system of claim 6 wherein the parametric features of the shared design history do not create any cycles during the execution of the parametric features of the shared design history.

11. A non-transitory storage device having instructions stored thereon that, when executed by one or more computers, cause the computers to perform operations comprising:

receiving input defining one or more first parametric features arranged in a first order to create a bottom-up component in an assembly;

adding the first parametric features to a shared design history according to the first order, and wherein a first parametric features of the first order defines a respective primary orientation of the bottom-up component in the assembly;

receiving input defining one or more second parametric features arranged in a second order to create a top-down component in the assembly;

adding the second parametric features to the shared design history according to the second order and following the first parametric features in the shared design history wherein a first parametric feature of the second order defines a respective primary orientation of the top-down component in the assembly, and wherein one or more of the second parametric features reference the bottom-up component in the respective primary orientation of the bottom-up component;

receiving input to position the bottom-up component to create a respective secondary orientation of the bottom-up component in the assembly;

after receiving the input to position the bottom-up component, receiving input defining one or more third parametric features of the top-down component arranged in a third order wherein at least one of the third features references the bottom-up component in the respective primary orientation of the bottom-up component;

adding the third parametric features to the shared design history according to the third order and following the second parametric features in the shared design history; and generating a model by executing the parametric of the shared design history according to the order of the parametric features in the shared design history.

12. The storage device of claim 11, wherein the operations further comprise:

adding one or more parametric features to capture the respective secondary orientation of the bottom-up component to the shared design history following the third parametric features.

13. The storage device of claim 11 wherein generating the model by executing the parametric features of the shared design history according to the order of the parametric features in the shared design history comprises:

executing the first parametric features to create the bottom-up component in the respective primary orientation of the bottom-up component; and after executing the first parametric features, executing the second parametric features to create the top-down component in the respective primary orientation of the top-down component.

14. The storage device of claim 11 wherein each parametric feature is an extrusion, a cut, a fillet, a sketch, a shell, or a position in the assembly.

15. The storage device of claim 11 wherein the parametric features of the shared design history do not create any cycles during the execution of the parametric features of the shared design history.

* * * * *

UNITED STATES PATENT AND TRADEMARK OFFICE
CERTIFICATE OF CORRECTION

PATENT NO. : 8,463,581 B2
APPLICATION NO. : 12/556494
DATED : June 11, 2013
INVENTOR(S) : David J. Corcoran and Heung-Wing Li Page 1 of 1

It is certified that error appears in the above-identified patent and that said Letters Patent is hereby corrected as shown below:

In the Claims:

In Claim 6, column 26, line 49, delete "computer" and insert -- computers --.

In Claim 6, column 26, line 65, delete "features" and insert -- feature --.

In Claim 6, column 27, line 13, delete "featured" and insert -- features --.

In Claim 7, column 27, line 20, delete "operation" and insert -- operations --.

In Claim 7, column 27, line 23-25, after "component" delete "features to capture the respective secondary orientation of the bottom-up component".

In Claim 11, column 27, line 53, delete "features" and insert -- feature --.

In Claim 11, column 28, line 27, after "parametric" insert -- features --.

Signed and Sealed this
Eighth Day of October, 2013

Teresa Stanek Rea
*Deputy Director of the United States Patent and Trademark Office*